United States Patent
Wakatsuki et al.

[11] Patent Number: 5,861,705
[45] Date of Patent: Jan. 19, 1999

[54] TUNING-FORK VIBRATORY GYRO AND SENSOR SYSTEM USING THE SAME

[75] Inventors: Noboru Wakatsuki, Ishinomaki; Masaaki Ono; Sumio Yamada, both of Kawasaki; Kazutugu Kikuchi, Yokosuka; Motoi Yamauchi, Ichinomiya, all of Japan

[73] Assignee: Fujitsu Limited, Kawasaki, Japan

[21] Appl. No.: 628,530

[22] Filed: Apr. 4, 1996

Related U.S. Application Data

[63] Continuation-in-part of Ser. No. 514,627, Aug. 14, 1995, abandoned.

[30] Foreign Application Priority Data

Nov. 1, 1994 [JP] Japan .................................. 6-268976

[51] Int. Cl.$^6$ .............................. H01L 41/047; G01P 9/04
[52] U.S. Cl. ........................ 310/370; 310/326; 310/365; 73/504.16
[58] Field of Search .................... 310/316, 326, 310/365, 370; 73/504.16

[56] References Cited

U.S. PATENT DOCUMENTS

| | | | |
|---|---|---|---|
| 3,683,213 | 8/1972 | Staudte | 310/370 |
| 4,069,434 | 1/1978 | Kawai et al. | 310/370 |
| 4,099,078 | 7/1978 | Shibata et al. | 310/370 |
| 4,349,763 | 9/1982 | Hoshi et al. | 310/370 |
| 4,379,244 | 4/1983 | Dinger | 310/312 |
| 4,384,232 | 5/1983 | Debely | 310/370 |
| 4,540,909 | 9/1985 | Takahashi et al. | 310/370 |
| 4,654,663 | 3/1987 | Alsenz et al. | 340/870.3 |
| 4,703,655 | 11/1987 | Konno et al. | 73/505 |
| 4,930,351 | 6/1990 | Macy et al. | 73/505 |
| 5,251,483 | 10/1993 | Söderjvist | 73/505 |
| 5,329,816 | 7/1994 | Soderkvist et al. | 73/505 |
| 5,386,726 | 2/1995 | Terajima | 73/505 |
| 5,388,458 | 2/1995 | Weinberg et al. | 73/505 |
| 5,420,548 | 5/1995 | Nakajima | 310/370 |
| 5,438,231 | 8/1995 | Khoshnevisan et al. | 310/321 |
| 5,451,828 | 9/1995 | Tomikawa et al. | 310/370 |
| 5,481,913 | 1/1996 | Ito et al. | 73/504.16 |
| 5,533,397 | 7/1996 | Sugitani et al. | 73/504.16 |
| 5,537,872 | 7/1996 | Frere et al. | 73/504.12 |
| 5,585,562 | 12/1996 | Kurata et al. | 73/504.16 |

FOREIGN PATENT DOCUMENTS

| | | | |
|---|---|---|---|
| 28 20 236 | 11/1978 | Germany | 310/326 |
| 53-70785 | 6/1978 | Japan | 310/326 |
| 53-79486 | 7/1978 | Japan | 310/370 |
| 55-13553 | 1/1980 | Japan | H03H 9/10 |
| 55-75319 | 6/1980 | Japan | 310/370 |
| 56-94813 | 7/1981 | Japan | H03H 9/81 |
| 57-60720 | 4/1982 | Japan | 310/370 |
| 57-188124 | 11/1982 | Japan | 310/370 |
| 58-105612 | 3/1983 | Japan | 310/370 |
| 2-15707 | 1/1990 | Japan | 310/326 |

*Primary Examiner*—Thomas M. Dougherty
*Attorney, Agent, or Firm*—Armstrong, Westerman, Hattori, McLeland & Naughton

[57] ABSTRACT

A vibratory gyro including a tuning-fork vibrator having a piezoelectric member and a supporting member supporting the tuning-fork vibrator. The tuning-fork vibrator has a driving-side vibration mode and a detection-side vibration mode. The tuning-fork vibrator resonates in the driving-side vibration mode, and the tuning-fork vibrator and the supporting member resonate as a whole in the detection-side vibration mode.

28 Claims, 27 Drawing Sheets fy MODE

STEADY POINT fx MODE

STEADY CENTER LINE

FIG. 5A    FIG. 5B    FIG. 5C
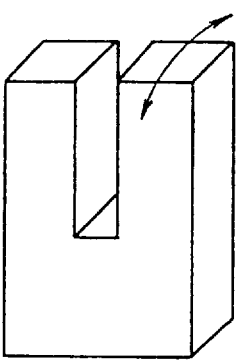
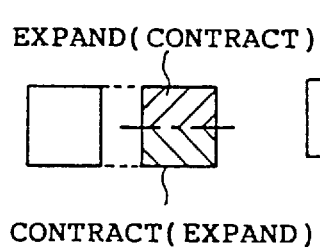
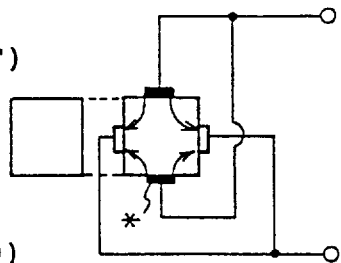
FIG. 6
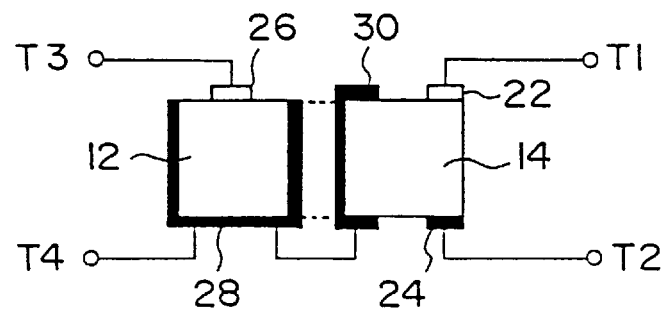

FIG. 12

| | fx-MODE VIBRATION | | fy-MODE VIBRATION | |
|---|---|---|---|---|
| | RESONANCE FREQUENCY | Q-VALUE | RESONANCE FREQUENCY | Q-VALUE |
| NO SUPPORTING MEMBER | (STANDARD) | 18000 ~ 20000 | (STANDARD) | 5000 ~ 7000 |
| ALUMINA BOARD | ≦3 Hz | ~ 18000 | -1.3 kHz | 700 ~ 800 |
| EPOXY PRINTED CIRCUIT BOARD | ≦3 Hz | ~ 18000 | -1.7 kHz | 500 ~ 300 |
| LIQUID CRYSTAL POLYMER PLATE | ≦3 Hz | ~ 18000 | — | — |

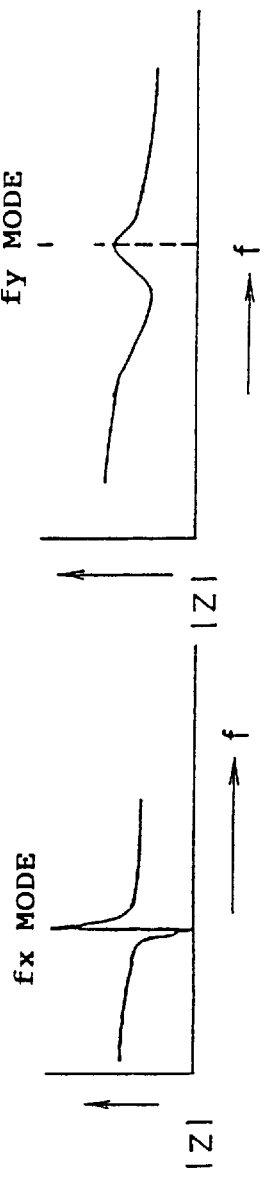
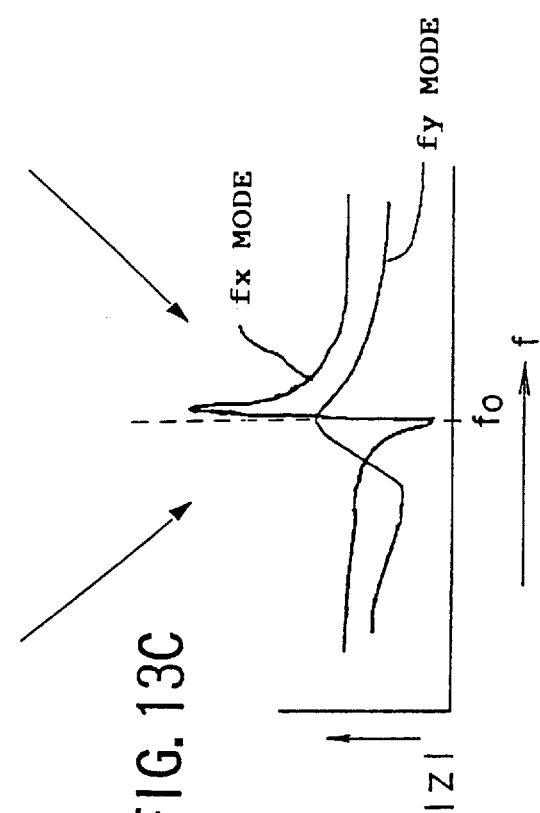
FIG. 13A
FIG. 13B
FIG. 13C

TUNING-FORK VIBRATORY GYRO AND SENSOR SYSTEM USING THE SAME

CROSS-REFERENCE TO RELATED APPLICATION

This application is a continuation-in-part application of application Ser. No. 514,627, filed Aug. 14, 1995 now abandoned.

BACKGROUND OF THE INVENTION

1. Field of the Invention

The present invention generally relates to tuning-fork type vibratory gyros, and more particularly a tuning-fork type vibratory gyro having a piezoelectric substance.

2. Description of the Related Art

A gyroscope has been used to determine the current position of a vehicle such as an airplane, ship or a satellite. Recently, a gyroscope has been applied to devices for personal use, such as car navigation and vibration detection in video cameras and still cameras.

A conventional coma gyro detects an angular velocity by utilizing a principle such that a coma (disk) which is rotating continues to rotate without any change of the attitude thereof while keeping the rotation axis even when a device equipped with the coma gyro is tilted. Recently, an optical type gyro or a piezoelectric type gyro has been developed and has come into practical use. The principles of the piezoelectric type gyro were proposed around 1950. Various piezoelectric type gyros having, for example, a tuning-fork, a cylinder or a semi-spherical member have been proposed. Recently, a vibratory gyro having a piezoelectric member has been in practical use. Such a vibratory gyro has less measurement sensitivity and precision than those of the coma gyro and the optical gyro, but has advantages in terms of size, weight and cost.

A conventional vibratory gyro having a piezoelectric substance utilizes the fact that the Coriolis force takes place in a direction perpendicular to a vibration of an object when an angular velocity is applied to the vibrating object. The principle of such a piezoelectric type vibratory gyro can be analyzed as a dynamic model (see, for example, ELASTIC WAVE DEVICE HANDBOOK, Ohmu Sha, pp. 491–497). Various types of piezoelectric type vibratory gyros have been proposed. For example, the above handbook shows a Sperry tuning-fork gyro, a Watson turning-fork gyro, a vibrating reed gyro and a cylinder type vibratory gyro.

Yet another type of a piezoelectric type gyro using a vibrating reed (flexural mode vibrator) made of a single crystal of $LiTaO_3$ has been proposed (see, for example, Konno et al., "EXPERIMENTS ON ANGULAR RATE SENSOR USING $LiTaO_3$ FLEXURAL MODE VIBRATOR", 1986 Autumn National Convention Record, The institute of Electronics and Communication engineers of Japan, P1-79). Further, Japanese Laid-Open Patent Application No. 61-294311 discloses a tuning-fork type gyro using piezoelectric ceramics. The gyro proposed in the above application uses a vibrator having two arms respectively having different polarizations so as to function as a driving arm and a detection arm, respectively.

The above piezoelectric type gyro having the $LiTaO_3$ single crystal has a little loss and good temperature performance. However, this gyro has a symmetrical structure and has almost the same mechanical Q values of the two orthogonal modes. The response performance as a sensor depends on the mechanical Q value of a piezoelectric element. Hence, it is not desirable that the piezoelectric element be driven with a high Q value. If the piezoelectric element is driven with a high Q value, the response performance will be degraded, while a vibration due to the Coriolis force to be detected has a high Q value. For example, it is required that a piezoelectric gyro applied to a vibration in hand-carried devices respond to frequencies of tens of heltz. For this requirement, there is an upper limit of the mechanical Q. Further, as a problem encountered when mounting the gyro to a supporting element, it is very difficult to hold the steady point (which corresponds to a node of vibration) of the piezoelectric element with a high precision.

The above-mentioned tuning-fork gyro having piezoelectric ceramic needs a polarizing process having a number of steps for producing the different polarizations, and is therefore expensive. The above-mentioned Laid-Open Japanese application does not provide any useful considerations regarding the gyro mounting method, frequency adjusting and setting of the mechanical Q values of the driving-side and detection-side vibrations.

SUMMARY OF THE INVENTION

It is a general object of the present invention to provide a tuning-fork type vibratory gyro and a sensor system using the same, in which the above disadvantages are eliminated.

A more specific object of the present invention is to provide a tuning-fork type vibratory gyro and a sensor system which can be simply mounted and has a high sensitivity in detecting a desired vibration.

The above objects of the present invention are achieved by a vibratory gyro comprising: a tuning-fork vibrator having a piezoelectric member; and a supporting member supporting the tuning-fork vibrator. The tuning-fork vibrator has a driving-side vibration and a detection-side vibration. The turning-fork vibrator resonates in the driving-side vibration, and the turning-fork vibrator and the supporting member resonate as a whole in the detection-side vibration.

The above objects of the present invention are also achieved by a sensor system comprising: a vibratory gyro; a driving circuit which drives the vibratory gyro; and a detection circuit which detects an output signal output from the vibratory gyro. The vibratory gyro is configured as described above.

For example, a resonance frequency of the driving-side vibration is equal to or approximately equal to an anti-resonance frequency of the detection-side vibration. Thereby, it becomes possible to effectively and efficiently sense the output resulting from the Coriolis force.

For example, a mechanical Q value of the detection-side vibration is smaller than the driving-side vibration. Hence, the Q value of the detection-side vibration becomes smaller than that of the driving-side vibration, so that the output resulting from the Coriolis force can be effectively and efficiently obtained.

For example, the tuning-fork vibrator includes: first and second arms; detection electrodes provided on the first arm; and driving electrodes provided on the second arm. That is, the electrodes are separately provided to the first and second arms. Hence, it is easy to form the electrodes.

For example, the tuning-fork vibrator comprises a ground electrode provided on the second arm so that the driving electrodes are in a floating state with respect to the ground electrode. Hence, an unwanted electrical coupling between the first and second arms can be prevented.

For example, the detection electrodes include an electrode connected to said ground electrode. The same advantage as described above can be obtained.

For example, the second arm has a rectangularly shaped cross section; and said electrode connected to said ground electrode is provided on three surfaces out of four surfaces of said second arm. With this structure, a high shielding effect can be obtained.

For example, the supporting member comprises means for adjusting an elastic characteristic of the supporting member so that an anti-resonance frequency of the detection-side vibration is equal to a resonance frequency of the driving-side vibration. That is, it is not necessary to adjust the tuning-fork vibrator.

For example, the above means comprises a groove for adjusting a stiffness of the supporting member, so that the frequency adjustment can be easily carried out.

For example, the above means comprises a weight member provided on the supporting member, so that the frequency adjustment can be easily carried out.

For example, the vibrator has a thickness equal to or nearly equal to a thickness of the supporting member. Hence, it is possible to easily attach the vibrator and the supporting member together and to realize the detection-side vibration in which the vibrator and the supporting member resonate as a whole.

For example, there is provided an adhesive layer which fixedly secures the vibrator and the supporting member together.

For example, the supporting member comprises means for attenuating the detection-side vibration at a first end portion of the supporting member. Hence, the vibrations are not affected by a member which supports the supporting member.

For example, the above means comprises relatively wide portions and relatively narrow portions which are alternately arranged between the first end portion and a second end portion in which the vibrator is attached to the supporting member. Hence, the vibrations are not affected by a member which supports the supporting member.

For example, there is provided a supporting portion which supports the supporting member on a predetermined member, so that the supporting member can be easily supported without any influence to the vibrations.

For example, the supporting portion comprises a pin member and an elastic member supporting the pin member, so that the supporting member can be easily supported without any influence to the vibrations.

For example, there is provided a first pattern formed on the vibrator; a second pattern formed on the supporting member; and a connecting member electrically connecting the first pattern and the second pattern together. Hence, the electrical connections can be made easily so that high reliability can be ensured. For example, connecting member comprises one of solder and paste.

For example, the vibrator comprises a piezoelectric single crystal. In this case, a gyro having a little loss and good temperature characteristics can be produced.

BRIEF DESCRIPTION OF THE DRAWINGS

Other objects, features and advantages of the present invention will become more apparent from the following detailed description when read in conjunction with the accompanying drawings, in which:

FIGS. 5A, 5B and 5C are diagrams for explaining an arrangement of electrodes which cause an fy-mode vibration in the turning fork;

FIG. 6 is a diagram of a practical arrangement of electrodes;

FIG. 12 is a diagram showing the relationship among the modes, resonance frequencies, Q values and materials used to form the supporting member;

FIG. 13A, 13B and 13C are diagrams for explaining a method of equalizing the resonance frequency of the fx-mode vibration and the anti-resonance frequency of the fy-mode vibration;

DETAILED DESCRIPTION OF THE PREFERRED EMBODIMENTS

Figure 1A:
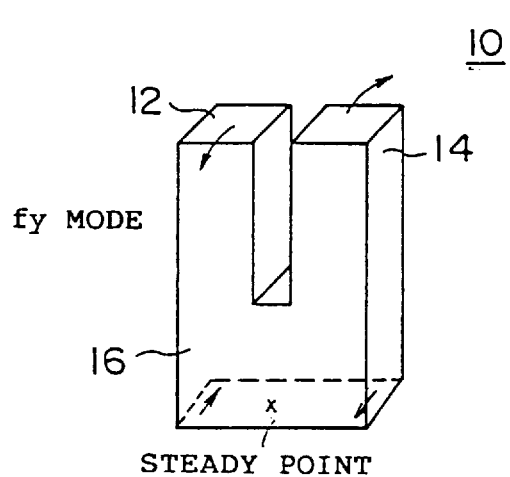
FIGS. 1A and 1B are perspective views of a tuning fork.
Figure 1B:
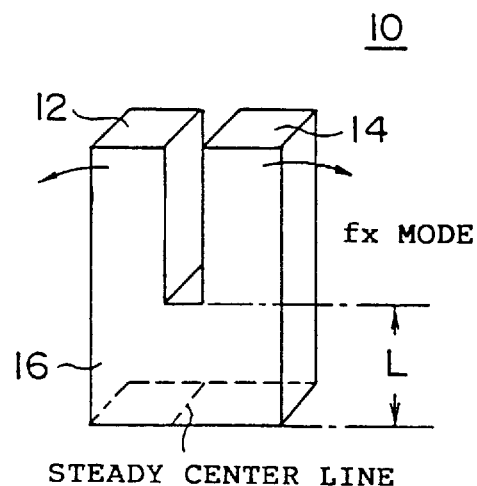
Figure 1B:
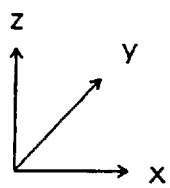

First of all, a description will now be given, with reference to FIGS. 1A and 1B, of a vibration of a tuning-fork vibrator.

A tuning-fork vibrator (hereinafter simply referred to as a tuning fork) 10 includes two arms 12 and 14, and a base portion 16 supporting the arms 12 and 14. Each of the arms 12 and 14 has a rectangularly shaped cross section. The tuning fork 10 has two different types of vibrations, one of which is a plane-vertical vibration (FIG. 1A) and the other vibration is an in-plane vibration (FIG. 1B). Hereinafter, the plane-vertical vibration is referred to as an fy-mode vibration, and the in-plane vibration is referred to as an fx-mode vibration. Vibrations of ordinary quartz tuning-forks are the fx-mode vibrations as shown in FIG. 1B.

The fx-mode vibration and the fy-mode vibration are different vibration modes. As shown in FIG. 1A, the fy-mode vibration includes torsional vibrations (indicated by arrows depicted with broken lines), and hence has a steady point indicated by "x" and located on the bottom surface of the bottom portion 16. This means that it is very difficult to support the tuning fork. The fx-mode vibration shown in FIG. 1B has a steady line (not point), which corresponds to the center line on the bottom surface of the bottom portion 16. Hence, it is possible to reduce the movement of the bottom surface of the bottom portion 16 to approximately zero by adjusting the length L of the bottom portion 16.

Figure 2A:
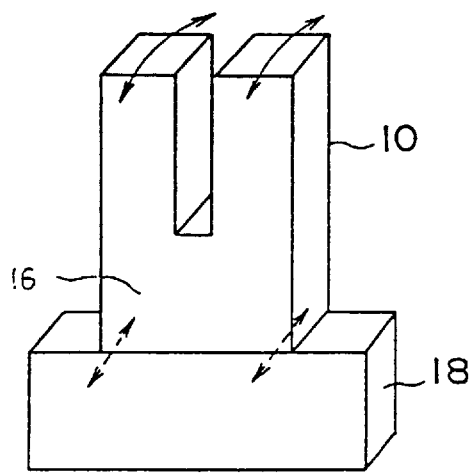
FIGS. 2A and 2B are perspective views illustrating the principle of the present invention.
Figure 2B:
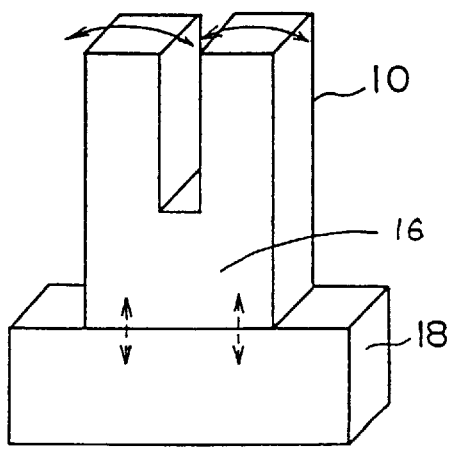

The present invention was made with the above in mind. More particularly, as shown in FIGS. 2A and 2B, a supporting member 18 is elastically attached to the base portion 16 of the tuning fork 10. The fy-mode vibration gives torsional stresses to the supporting member 18 as shown by broken-line arrows in FIG. 2A, while the fx-mode vibration gives compressive stresses to the supporting member 18. By selecting an appropriate length L of the bottom portion 16 with respect to the total length of the tuning fork 10, it is possible to suppress most of the fx-mode vibrations around the bottom portion 16 and to substantially neglect the influence of the supporting member 18. On the other hand, a torsional displacement of the fy-mode vibration is very much greater than a longitudinal displacement of the fx-mode vibration.

Taking into account the above considerations, the present invention tuning-fork vibration gyro uses the fx-mode vibration mode as a driving vibration mode, and the fy-mode vibration mode as a detection vibration mode. It is required that a constant vibration continue in the driving vibration mode. The detection sensitivity is proportional to the magnitude of the driving vibration, so that the driving vibration mode can be a vibration mode having a high Q value. With the above in mind, the tuning fork 10 is supported by the supporting member 18 as follows. The arms 12 and 14 vibrate (resonate) in the fx-mode vibration formation on the driving side independently of the supporting member 18. Further, the arms 12 and 14 vibrate (resonate) in the fy-mode vibration formation on the detection side so that the fy-mode vibration takes place in the tuning fork 10 and the supporting member 18 as a whole.

With the above structure, it becomes possible to select a high mechanical Q value of the driving vibration mode to thereby cause a large fx-mode vibration and to select the mechanical Q value of the detection vibration mode to a value less than the mechanical Q value of the driving vibration mode. As a result, it becomes possible to provide an easy-mounting, highly sensitive gyro. Particularly, since the fy-mode vibration on the detection side takes place so if the tuning fork 10 and the supporting member 18 are an integrally formed member, it is possible to vary the resonance frequency or the mechanical Q value by selecting the shape and material of the supporting member 18, as will be described in detail later and to thus select a desirable frequency band of detection side vibrations.

Figure 3:
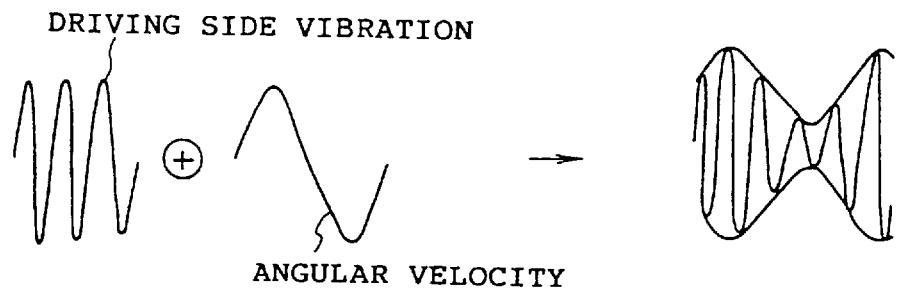
FIG. 3 is a waveform diagram of a vibration of the tuning fork.

As shown in FIG. 3, a vibration takes place in the gyro, the vibration being a vibration obtained by modulating a sine wave of the driving-side vibration by an angular velocity assumed as having a sine wave. In order to detect the above modulated vibration, a frequency band is needed in which it has the side bands on the both sides of the center frequency of the modulated vibration. If the detection side has a large mechanical Q value, the above frequency band including the side bands cannot be obtained. According to the present invention, it is possible to easily determine and select a mechanical Q value so that a desirable frequency range having the side bands can be obtained.

A description will now be given, with reference to FIGS. 4A, of electrodes for driving the fx-mode vibration and electrodes for detecting the fy-mode vibration.

Figures 4A, 4B, 4C:
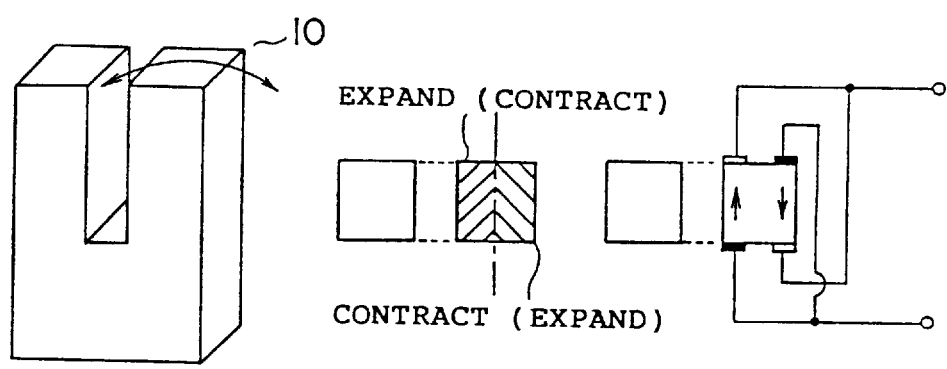
FIGS. 4A, 4B and 4C are diagrams for explaining an arrangement of electrodes which cause an fx-mode vibration in the tuning fork.

FIG. 4A shows electrodes for driving the fx-mode vibration. The fx-mode vibration is based on flexural oscillation. As shown in FIG. 4B, an arm is partitioned into two portions along the direction perpendicular to the direction of the fx-mode vibration, and an voltage is applied so that one of the two partitioned portions expands and the other portion contracts. FIG. 4C shows an arrangement of electrodes which results in the above displacements. Two pairs of electrodes are arranged, as shown in FIG. 4C. The two arrows in FIG. 4C indicate the directions of the electric fields caused by applying the driving voltage across the electrodes.

FIG. 5A shows electrodes for detecting the fy-mode vibration. The fy-mode vibration is also based on flexural oscillation. As shown in FIG. 5B, when an arm is partitioned into two portions along the direction perpendicular to the direction of the fy-mode vibration, one of the two arm portions expands, while the other arm portion contracts. By providing electrodes as shown in FIG. 5C, it is possible to detect a voltage resulting from the fy-mode vibration.

When the electrodes shown in FIG. 4C are applied to one of the two arms 12 and 14, and the electrodes shown in FIG. 5C are applied to the other arm, the electrical coupling between the electrodes for driving the fx-mode vibration and the electrodes for detecting the fy-mode vibration cannot be suppressed perfectly. If there is some electric coupling, a vibration in an unwanted mode will occur and will be coupled to the fx-mode vibration and/or the fy-mode vibration. Such an electric coupling may degrade the detecting precision.

FIG. 6 shows an arrangement of electrodes taking into account the above. The fx-mode vibration is driven through the arm 14, and the fy-mode vibration is detected through the arm 12. Two electrodes 22 and 24 are provided on edge portions of the opposing surfaces of the arm 14. Further, an electrode 30 is provided to the arm 14 so that the electrode 30 has a portion on the surface of the arm facing the arm 12 and portions respectively provided on the surfaces on which the electrodes 22 and 24 are provided. The two pairs of electrodes are used in FIG. 4C, while one pair of driving electrodes is used. The pair of driving electrodes is capable of causing the fx-mode vibration. The electrode 30 functions as a ground electrode, and is electrically connected to an electrode 28, which is one of the detection-side electrodes provided to the arm 12. A driving voltage is applied across the electrodes 22 and 24 via terminals T1 and T2.

The detection-side electrodes include an electrode 26 in addition to the above electrode 28. The electrode 28 functions as a ground electrode, and is provided on three surfaces of the arm 12. The electrode 26 is provided on the remaining surface of the arm 12. The electrode arrangement shown in FIG. 6 corresponds to an arrangement obtained by deleting the electrode denoted by an asterisk (*) from the arrangement shown in FIG. 5C. A detection voltage corresponding to the fy-mode vibration is obtained across the electrodes 26 and 28 via terminals T3 and T4.

The electrode 30 is set to the ground potential via the electrode 28, which covers the three surfaces of the arm 12. Hence, the shielding effect with respect to the electrodes 22 and 24 can be obtained. Also, the electrode 24 can be used in a floating state with respect to the ground. This facilitates circuit design. Further, the electrode 28 covering the three surfaces of the arm 12 can be easily formed, so that a coupling with the driving mode due to a positional error of the electrodes can be reduced.

Figure 7:
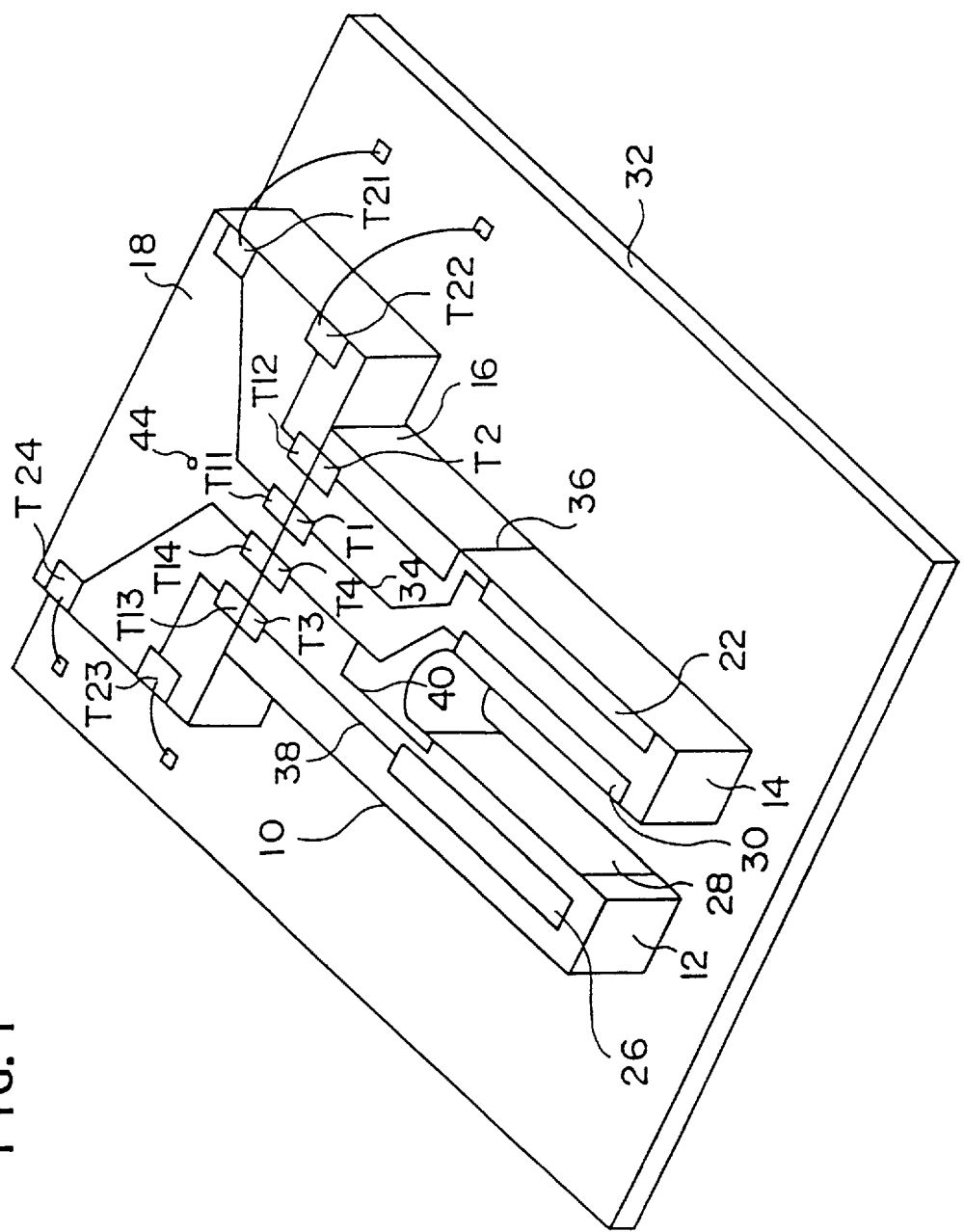
FIG. 7 is a perspective view of a tuning-fork type vibratory gyro according to an embodiment of the present invention.

FIG. 7 is a perspective view of an embodiment of the present invention based on the above-mentioned principles. In FIG. 7, parts that are the same as those shown in the previously described figures are given the same reference numbers. The piezoelectric type vibratory gyro shown in FIG. 7 includes the tuning fork 10 and the supporting member 18, which is supported by a base board 32 such as a printed circuit board or a case.

Figure 11:
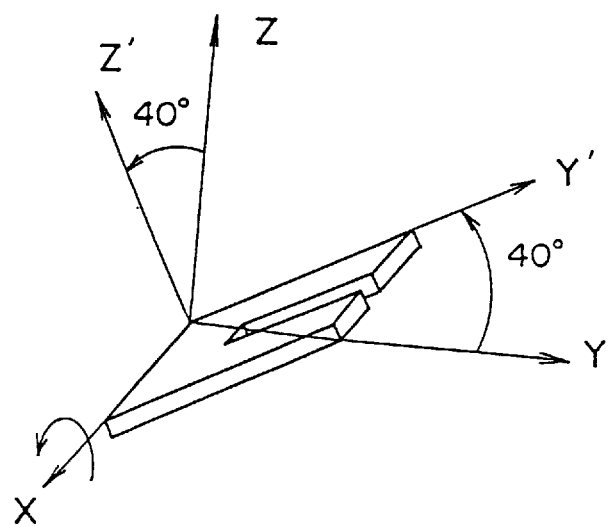
FIG. 11 is a diagram of a piezoelectric single crystal used to form the tuning fork.

The tuning fork 10 can be made of a piezoelectric bulk such as a piezoelectric single crystal or a piezoelectric member provided on a thin plate. An example of such a piezoelectric single crystal is a 130° rotation y-plate of LiTaO$_3$ shown in FIG. 11. The single crystal has less inner loss than ceramics and provides a tuning fork without hysteresis. A slit which defines the two arms is formed in a 130° rotation y-plate of LiTaO$_3$ of a rectangular shape by means of a dicing saw or wire saw. Next, a thin film (for example, NiCr/Au) is formed on all the surfaces of the y-plate, and is then patterned into the aforementioned electrodes by, for example, a light exposure method. At the same time as patterning the thin film, wiring lines are also formed by patterning.

The electrodes formed on the arms 12 and 14 shown in FIG. 7 are the same as those shown in FIG. 6. A wiring line 34 electrically connects the electrode 22 formed on the arm 14 and the terminal Ti together, and a wiring line 36 electrically connects the electrode 24 (which does not appear in FIG. 7) of the arm 14 and the terminal T2. A wiring line 38 electrically connects the electrode 26 formed on the arm 12 and the terminal T3, and a wiring line 40 electrically connects the electrode 12 formed on the arm 12 and the terminal T4. In order to avoid the electrodes and wiring patterns from affecting the vibrations as much as possible, it is desirable that the pattern and wiring lines formed on the tuning fork 10 be in a symmetrical arrangement. Further, in order to reduce the influence to the vibrations, it is desirable that the patterns formed on the supporting member 18 be in a symmetrical arrangement. The structure shown in FIG. 7 has a symmetrical arrangement on the supporting member 18 in which there are provided terminals T11–T14 to be respectively connected to the terminals T2, T1, T4, T3, terminals T21–T24 for external connections, and wiring lines connecting the electrodes together. The supporting member 18 is not limited to a rectangular shape, and may be of another shape.

The rectangularly-shaped supporting member 18 shown in FIG. 7 has a thickness equal to that of the tuning fork 10. This is because the supporting member 18 vibrates together with the tuning fork 10 in the fy-mode vibration. In addition, it is possible to facilitate the work for joining the bottom surface of the bottom portion 16 of the tuning fork 10 and the corresponding side surface of the supporting member 18 so that the related electrodes are arranged in a line.

Figure 8:
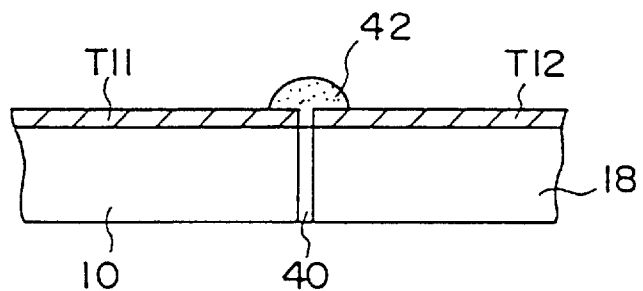
FIG. 8 is a cross-sectional view showing a joint of the tuning fork and a supporting member.

FIG. 8 shows a connection between the tuning fork 10 and the supporting member 18. An adhesive layer 40 is provided at the interface between the bottom surface of the bottom portion 16 and the corresponding side surface of the supporting member 18 so that the portion 16 and the member 18 are fixed together. The terminals of the tuning fork 10 (only the terminal T11 is shown in FIG. 8) can be electrically connected to the corresponding terminals of the supporting member 18 (only the terminal T21 is shown in FIG. 8) by soldering or an electrically conductive adhesive 42 shown in FIG. 8. The electrically conductive adhesive 42 can be solder or electrically conductive paste.

Figure 9:
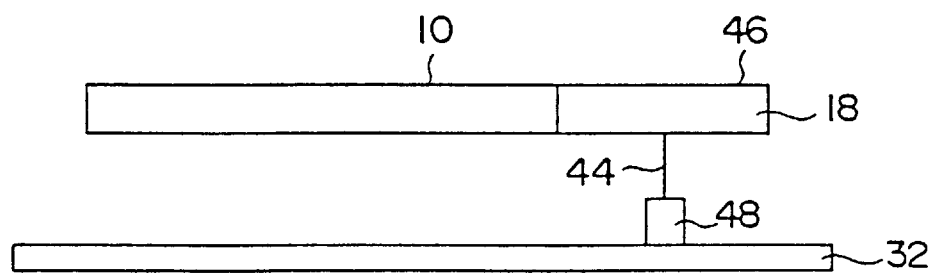
FIG. 9 is a side view of the gyro shown in FIG. 7.

As shown in FIGS. 8 and 9, a pin 44 attached to the supporting member 18 is attached to a base board 32, so that the gyro 10 can be supported. Regarding the fy-mode vibration, the supporting member 18 forms a part of the vibration system. Hence, if the supporting member 18 is directly attached to the supporting member 18 or the case, the vibration of the supporting member 18 is affected. With the above in mind, as shown in FIG. 9, a hole is provided at the center portion of the supporting member 18, and the pin 44 made of, for example, a metallic needle-shaped member, is inserted into the hole. The pin 44 is supported by an elastic member 48 which may be a cylindrical rubber member. The elastic member 48 is fixed to the base board 32. With the above structure, it becomes possible to prevent the fy-mode vibration from being leaked to the base board 32 and to prevent the vibration from the base board 32 from being transmitted to the tuning fork 10.

Figure 10:
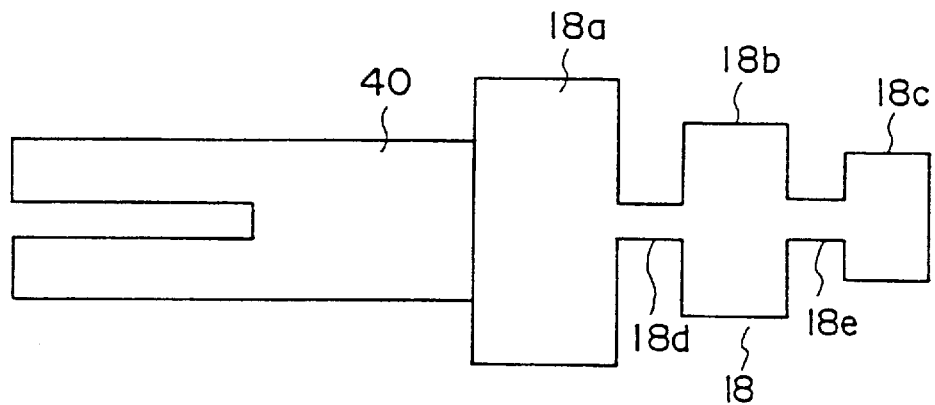
FIG. 10 is a plan view of an alternative supporting member.

FIG. 10 shows an alternative structure intended to attenuate the vibration from the base board 32. The supporting member 18 shown in FIG. 10 has wide portions 18a, 18b and 18c and narrow portions 18d and 18e, which are alternately provided. The alternate arrangement of the wide and narrow portions function so as to attenuate the vibrations.

The electrode terminals T21–T24 on the supporting member 18 and the corresponding terminals on the base plate 32 can be electrically connected together by bonding of soft wires made of, for example, copper.

FIG. 12 is a diagram of the resonance frequencies and the Q values for some materials forming the supporting member 18. More particularly, FIG. 12 shows an alumina supporting member, an epoxy printed circuit board and a liquid crystal polymer plate. Further, FIG. 12 shows the resonance frequencies and the Q values of the fx-mode vibration resonance mode and the fy-mode vibration resonance mode.

The following can be seen from FIG. 12. The resonance frequency and the Q value of the fx-mode vibration does not vary greatly before and after any one of the supporting members 18 is provided. On the other hand, the resonance frequency and the Q value of the fy-mode vibration varies greatly before and after the supporting member 18 is provided and on the basis of which one of the supporting members 18 is provided. This means that the fy-mode vibration occurs in the resonance system including the supporting member 18. Further, the Q value of the fy-mode vibration greatly depends on the material forming the supporting member 18. In other words, there is a material suitable for the desired Q value. When the supporting member 18 has a large loss, the fy-mode vibration including the tuning fork 10 has a small mechanical Q value. Generally, the supporting board 18 made of a mineral such as alumina has a small loss, while the board 18 made of epoxy resin or the like has a large loss. As described above, it is important to select the values of the parameters regarding the supporting member 18 to thus result in the fy-mode vibration in the vibration system, including the tuning fork 10 and the supporting member 18.

In order to efficiently and effectively obtain the detection output (voltage), it is preferable that the resonance frequency of the fx-mode vibration is set equal to the anti-resonance frequency of the fy-mode vibration.

FIG. 13A shows a variation in the impedance |z| of the fx-mode vibration as a function of frequency f (impedance characteristic). FIG. 13B shows an impedance characteristic of the fy-mode vibration. As shown in FIG. 13C, it becomes possible to obtain the maximum output developing across the terminals T23 and T24 shown in FIG. 7 by setting the resonance frequency of the fx-mode vibration (the frequency at which the minimum impedance is obtained) and the anti-resonance frequency of the fy-mode vibration (the frequency at which the maximum impedance is obtained).

Figure 14:
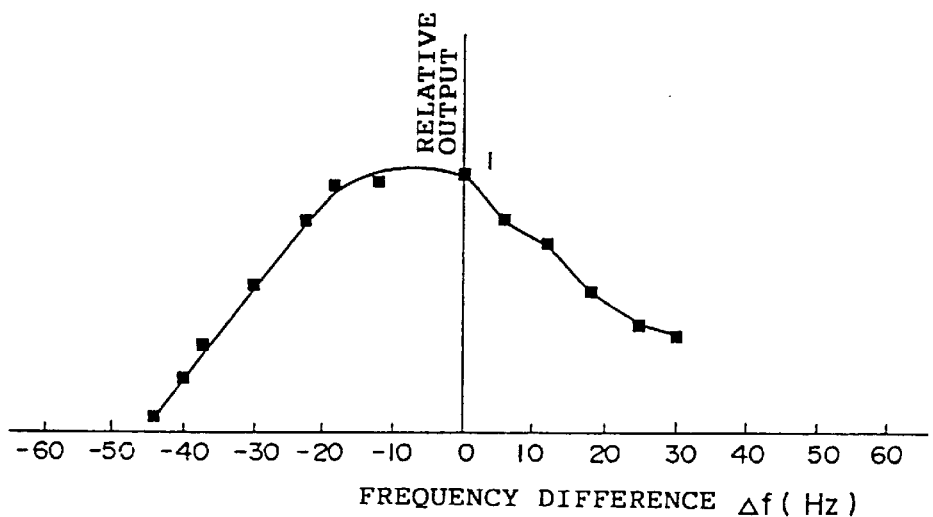
FIG. 14 is a graph of the relationship between a detection output and the difference between the resonance frequency and the anti-resonance frequency.

FIG. 14 is a graph showing the relationship between the normalized output voltage and the difference between the resonance frequency of the fx-mode vibration and the anti-resonance frequency of the fy-mode vibration of the gyro shown in FIG. 7. The output voltage is normalized so as to be 1 when the difference between the resonance frequency and the anti-resonance frequency is zero. It can be seen from FIG. 14 that the maximum output can be obtained when the frequency difference is zero. The graph was obtained by using a measurement system shown in FIG. 14, which will be described later.

It is possible to equalize the resonance frequency of the fx-mode vibration and the anti-resonance frequency of the fy-mode vibration to each other by varying the widths of the arms 12 and 14 and the width of the slit defining the arms 12 and 14. It may be difficult to perform the above adjusting work on the assembled state shown in FIG. 7.

With the above in mind, an alternative adjusting method is proposed based on the fact that the fy-mode resonance takes place as a whole in the resonance system including the tuning fork 10 and the supporting member 18. The adjusting method is intended to increase the output impedance obtained across the detection-side electrodes for the fy-mode vibration by varying the elastic characteristics of the supporting member 18. Further, it is preferable to use a high-impedance detector circuit which may be a cathode-follower (emitter-follower) circuit.

Figures 15A, 15B:
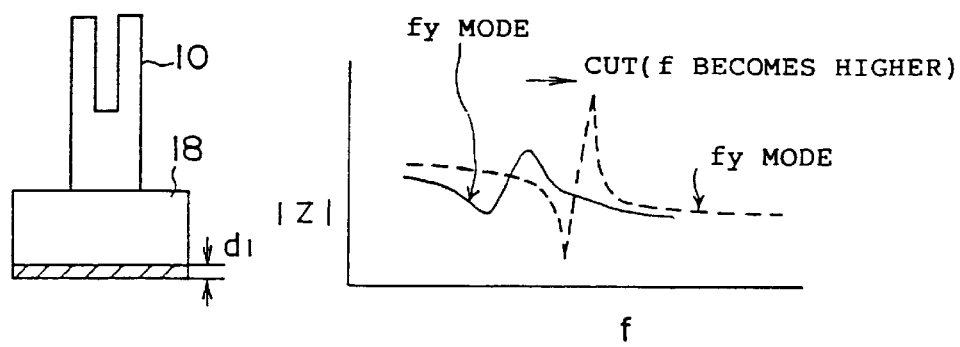
FIGS. 15A and 15B are diagrams showing a first method of adjusting the anti-resonance frequency of the fy-mode vibration.

FIGS. 15A and 15B show a first method for adjusting the anti-resonance frequency of the fy-mode vibration. The first method is to cut an end portion of the supporting member 18 on the other side thereof to which the tuning fork 10 is attached. This cutting is intended to reduce the weight of the supporting member 18. The cut portion is indicated as d1 in FIG. 15A. It is preferable to symmetrically cut the end portion of the supporting member 18. As the weight of the supporting member 18 decreases, the anti-resonance frequency of the fy-mode vibration increases, as shown in FIG. 15B. The end portion of the supporting member 18 is equally cut until the anti-resonance frequency of the fy-mode vibration becomes equal to the resonance frequency of the fx-mode vibration.

Figure 16A:
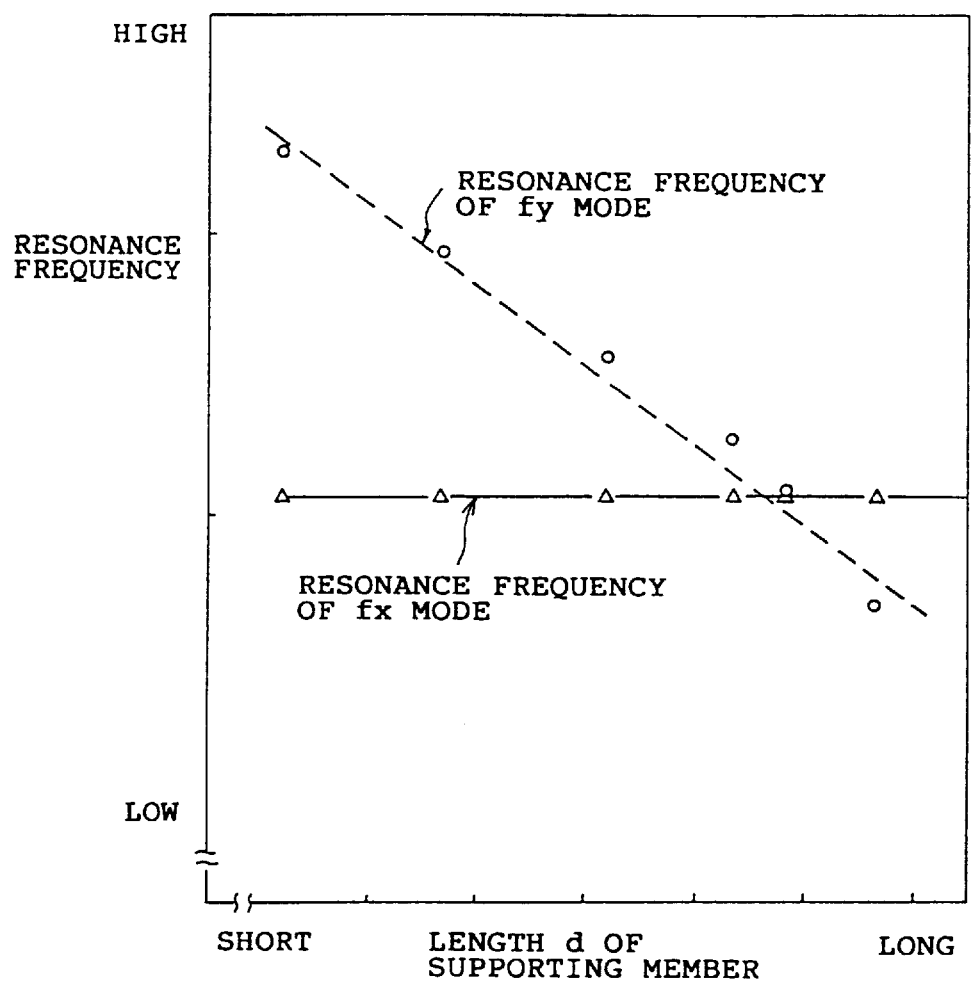
FIGS. 16A and 16B are diagrams showing the relationship between the length of the supporting member and the resonance frequency.
Figure 16B:
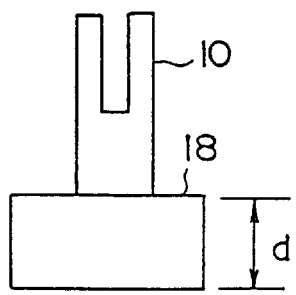

FIG. 16A shows the relationship between the resonance frequency of the fx-mode vibration and the resonance frequency of the fy-mode vibration as a function of the length d of the supporting member 18 shown in FIG. 16B. The fx-mode vibration is independent of the fy-mode vibration, and is thus almost constant. That is, the fx-mode vibration does not depend on the length d of the supporting member 18. On the other hand, the fy-mode vibration takes place in the resonance system including the supporting member 18, and thus the resonance frequency thereof becomes lower as the length d becomes larger. According to our experiments, the resonance frequency of the fy-mode vibration was changed between approximately 15 kHz and approximately 17 kHz along the corresponding line shown in FIG. 16A when the length d of the supporting member 18 having a width of 4.7 mm is changed between 6 mm and 12 mm.

Figure 17:
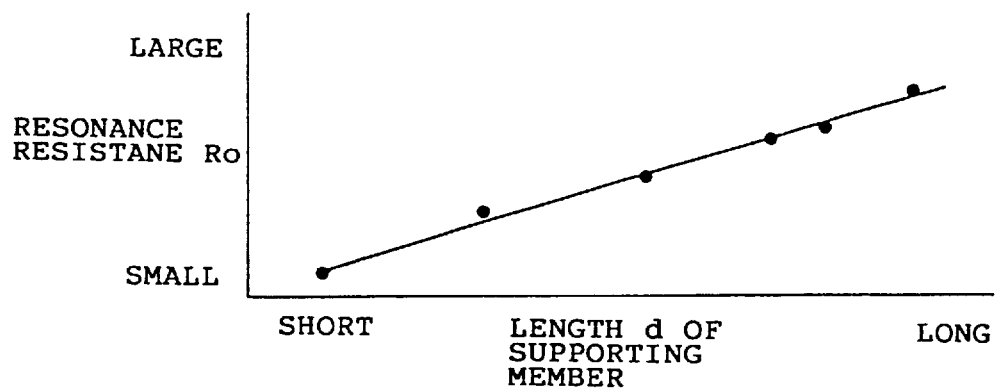
FIG. 17 is a graph of the relationship between the resonance resistance and the length of the supporting member.

FIG. 17 is a graph showing a variation in the resonance resistance Ro as a function of the length d of the supporting member 18. As the length d of the supporting member 18 becomes shorter, the resonance resistance Ro becomes lower and thus the resonance frequency becomes higher. According to our experiments, the resonance resistance Ro was changed between approximately 1.0 MΩ and approximately 1.5 MΩ along the line shown in FIG. 17 when the length d of the supporting member 18 having a width of 4.7 mm is changed between 6 mm and 12 mm.

Figure 18A:
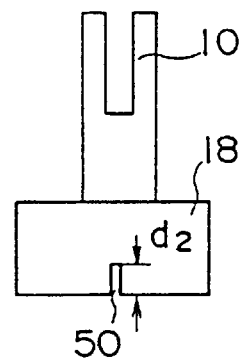
FIGS. 18A and 18B are diagrams showing a second method of adjusting the anti-resonance frequency of the fy-mode vibration.
Figure 18B:
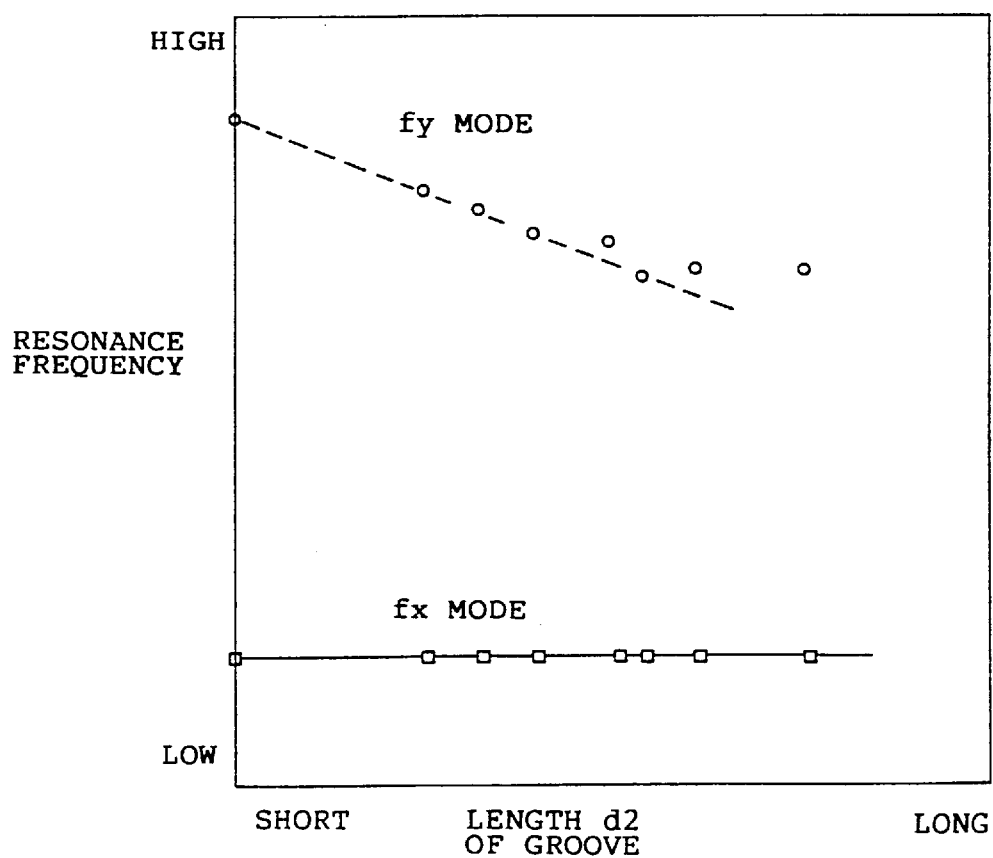

FIGS. 18A and 18B show a second method of equalizing the anti-resonance frequency to the resonance frequency. As shown in FIG. 18A, a groove 50 is provided symmetrically to the center line of the supporting member 18. The groove 50 can be formed on the surface portion of the supporting member 18 or can be connecting the opposing surfaces thereof together. The groove 50 is directed to adjusting the stiffness of the supporting member 18.

FIG. 18B is a graph showing the resonance frequencies of the fx-mode resonance and the fy-mode resonance as a function of the length d2 of the groove 50. The fx-mode vibration has an almost constant resonance frequency independent of the length d2 of the supporting member 18. On the other hand, the resonance frequency of the fy-mode vibration becomes lower as the length d2 of the supporting member 18 becomes longer. According to our experiments, the resonance frequency of the fy-mode vibration was changed from approximately 18 kHz to approximately 17 kHz along the line shown in FIG. 18B when the length d2 of the groove 50 formed in the supporting member 18 having a width of 4.7 mm and a length of 12.4 mm is changed from 0 mm to 2 mm.

Figure 19:
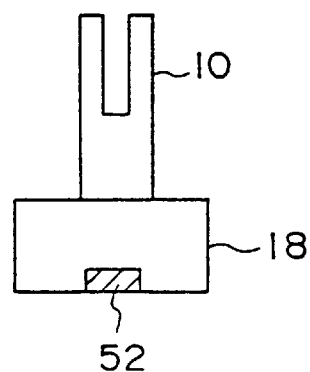
FIG. 19 is a diagram showing a third method of adjusting the anti-resonance frequency of the fy-mode vibration.

FIG. 19 shows a third method for adjusting the anti-resonance frequency of the fy-mode vibration. A weight 52 which may be rubber is added to the supporting member 18, so that the resonance frequency can be reduced. It is preferable to provide the weight 52 symmetrically with the center line of the supporting member 18 in order to prevent the weight 52 from affecting the fy-mode vibration.

Figure 20:
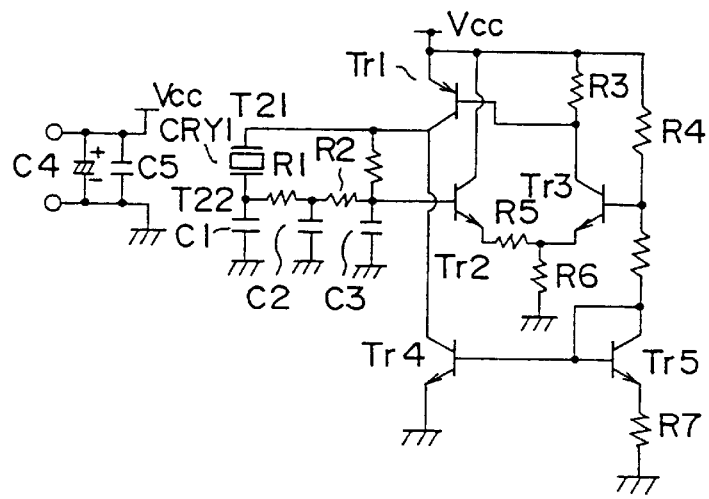
FIG. 20 is a circuit diagram of a driving circuit of a sensor system which employs the gyro shown in FIG. 7.

FIG. 20 is a circuit diagram of a driving circuit which is part of a sensor system using the gyro shown in FIG. 7. In FIG. 20, part of the gyro in which the fx-mode vibration takes place is indicated as a piezoelectric vibrator CRY1. The driving circuit shown in FIG. 20 is a self-oscillating circuit, which is made up of the vibrator CRY1, a phase shifter and an amplifier circuit. The phase shifter is made up of capacitors C1 through C3, and resistors R1 and R2. The amplifier circuit is made up of transistors Tr1 through Tr5 and resistors R3–R7. The piezoelectric vibrator CRY1 is connected between the input and output of the amplifier circuit. The phase shifter performs phase shifting so that a positive feedback can be obtained to cause the self-oscillating operation. The capacitors C4 and C5 form a power supply filter, which filters a power supply voltage Vcc, and outputs a filtered voltage to the self-oscillating circuit as a power supply. In FIG. 20, symbols T21 and T22 correspond to the terminals T21 and T22 provided on the supporting member 18 shown in FIG. 17.

Figure 21:
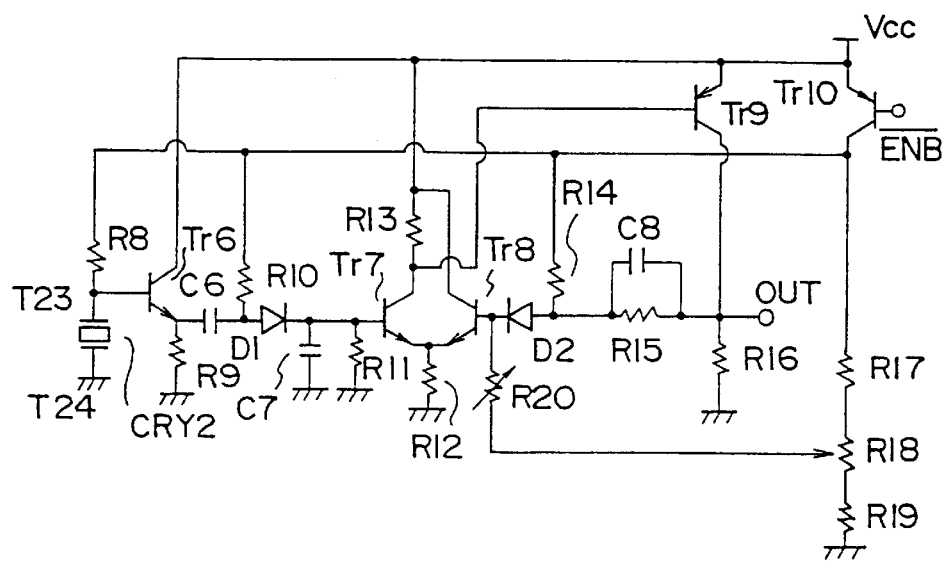
FIG. 21. is a circuit diagram of a detector circuit of the sensor system.

FIG. 21 is a circuit diagram of a detector circuit which is part of the sensor system using the gyro. In FIG. 21, a part of the gyro in which the fy-mode vibration takes place is indicated as a piezoelectric vibrator CRY2. The detector circuit shown in FIG. 21 is made up of the above vibrator CRY2, an amplifier circuit, a low-pass filter, a detection circuit, a low-pass filter and driving transistors Tr9 and Tr10. The amplifier circuit includes a transistor Tr6. The low-pass filter includes a capacitor C7 and a resistor R11. The detection circuit is made up of diodes D1 and D2, and transistors Tr7 and Tr8. The low-pass filter includes a capacitor C8 and a resistor R15. Further, the detector circuit includes resistors R8–R10, R12–R14, R16–R20, and a capacitor C6. The output of the transistor Tr6 is output via the emitter t hereof, and is applied to the base of the transistor Tr7 via the coupling capacitor C6, the diode D1 and the low-pass filter. Further, the collector current of the transistor Tr9 is applied to the base of the transistor Tr8 via the low-pass filter and the diode D2.

The base of the transistor Tr10 functions as a standby mode terminal. When an enable signal /ENB ("/" corresponds to bar shown in FIG. 21) switches to a low level (which corresponds to a bias level allowing the base current to flow), the detector circuit becomes active. Symbols T23 and T24 shown in FIG. 21 are the terminals T23 and T24 provided on the supporting member 18.

Figure 22:
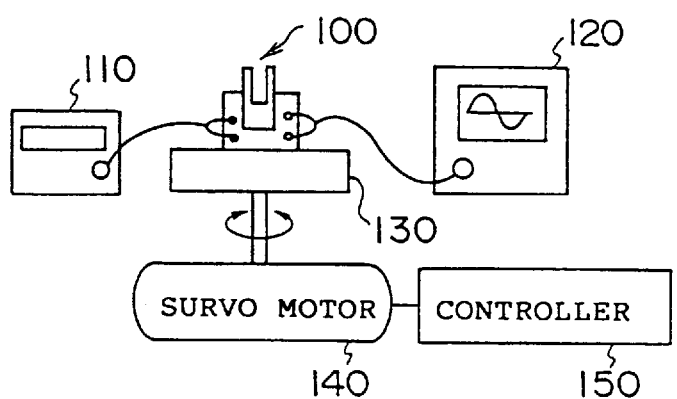
FIG. 22 is a block diagram of a measurement system used to measure characteristics of the gyro shown in FIG. 7.

FIG. 22 is a block diagram of a measurement system used to measure the characteristics of the tuning-fork type vibratory gyro using LiTaO$_3$ shown in FIG. 7 (hereinafter the gyro is indicated by reference number 100). A synthesizer 110 drives the fx-mode vibration. The gyro 100 attached to a stage 130 is rotated in the directions indicated of the arrows by means of a servo motor 140 under the control of a controller 150. The detection-side vibration (fy-mode vibration) is detected by an oscilloscope 120.

Figure 23:
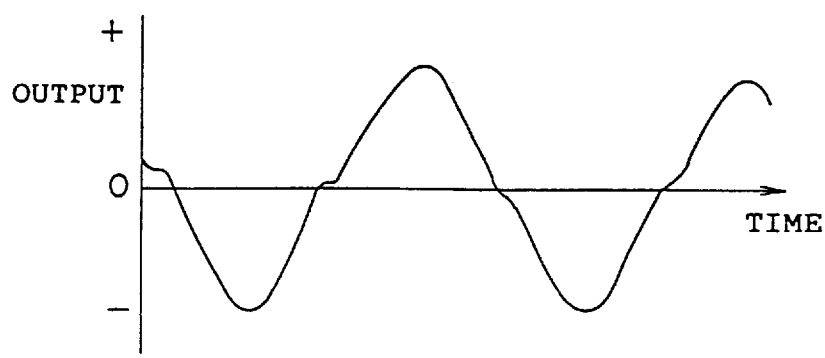
FIG. 23 is a waveform diagram of an output signal obtained through the measurement system shown in FIG. 22.

FIG. 23 is a graph of the detection result obtained by using the above measurement system. The detection output varies in sinusoidal form due to the rotation of the gyro 100.

Figure 24:
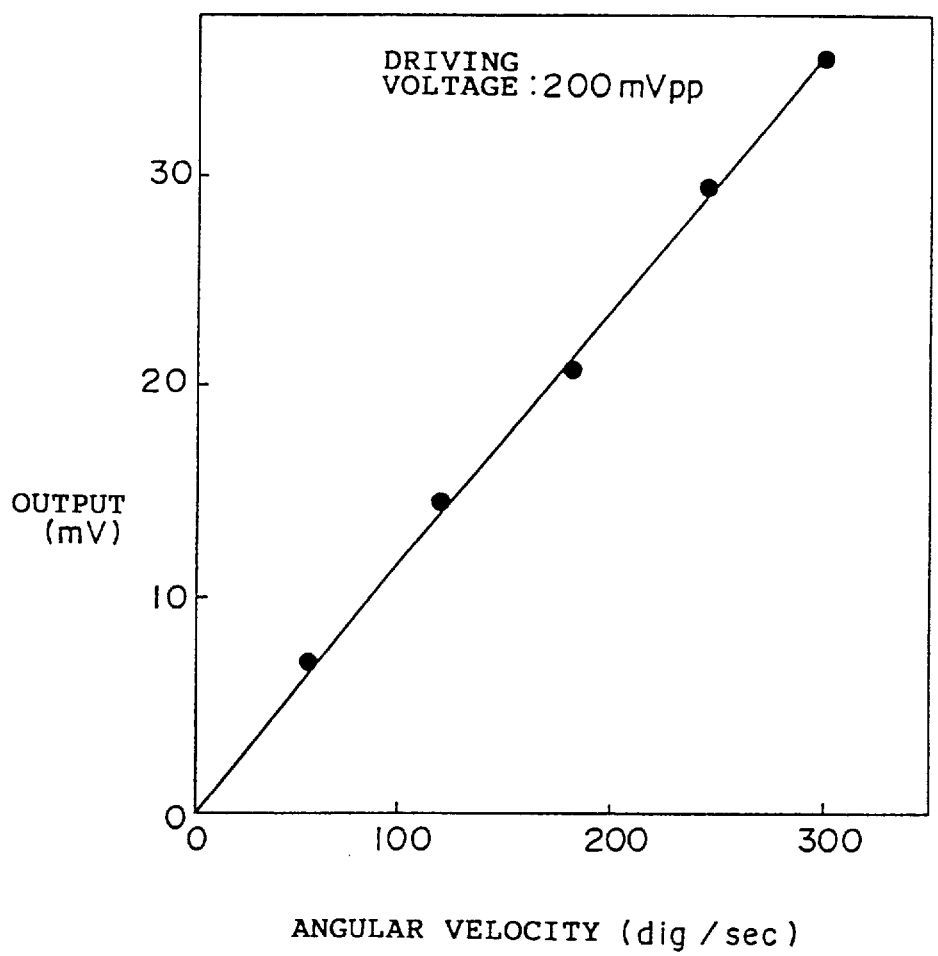
FIG. 24 is a graph of the relationship between the detected output and the angular velocity obtained through the measurement system shown in FIG. 22.

FIG. 24 is a graph of the relationship between the detection output (mV) and the angular velocity (dig/sec) obtained by the above measurement system. It can be seen from FIG. 24 that the detection output is approximately proportional to the angular velocity.

In practice, a leakage output (leakage voltage) may occur if the gyro has an error in the shape or size of the vibrator. Such an error results from a mechanical coupling between the two arms. Such a mechanical coupling is caused by an error in the dimensions of the vibrator and/or a positional error introduced in the adhering step. The leakage output is superimposed on the output due to the Coriolis force, so that the detection output (voltage) or sensitivity will be degraded. The mechanical coupling will be conspicuous when the anti-resonance frequency of the fy-mode vibration is set equal to or nearly equal to the resonance frequency of the fx-mode vibration.

Figure 25:
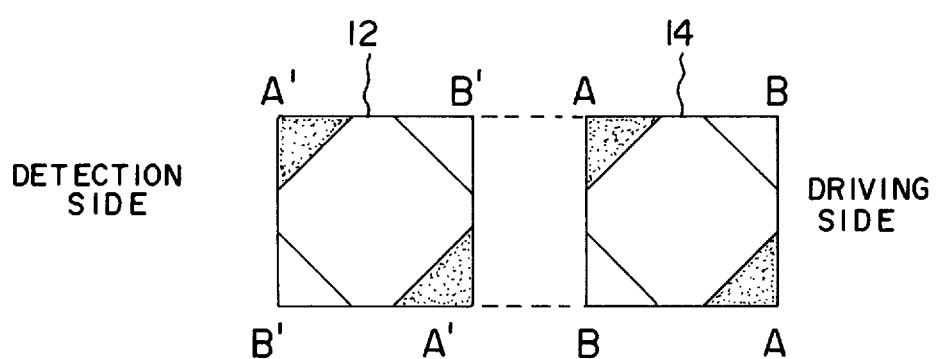
FIG. 25 is a diagram for explaining the principle of reducing the mechanical coupling.

If it is desired that the above-mentioned leakage output be eliminated or reduced, the aforementioned tuning fork 10 can be produced according to the principle shown in FIG. 25.

FIG. 25 is a plan view of the tuning fork 10, which has the detection-side arm 12 and the driving-side arm 14. The inventors found, through the experiments, two types of vibrators regarding the leakage output. One of the two vibrator types is such that the mechanical coupling can be reduced by cutting (trimming) at least one of two opposing corners A of the driving-side arm 14 on the diagonal thereof or/and two opposing corners A' and two opposing corners B' of the detection-side arm 12. The other vibrator type is such that the mechanical coupling can be reduced by cutting (trimming) at least one of two opposing corners B of the driving-side arm 14 on the diagonal thereof or/and at least one of the opposing corners A' and the two opposing corners B' of the detection-side arm 12. In the above experiments, a LiTaO$_3$ 130° rotation y-plate single crystal was used.

Figure 26:
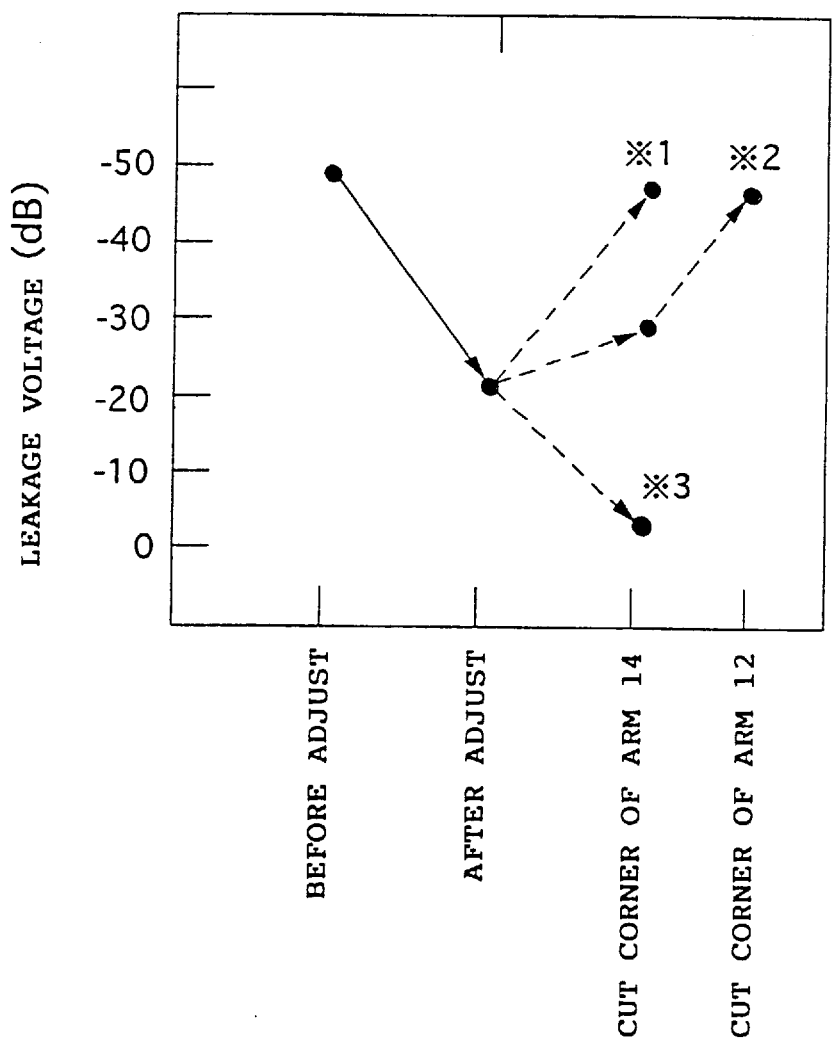
FIG. 26 is a graph showing variations in the mechanical coupling by means of corner trimming.

FIG. 26 is a graph showing the relationship between the corner trimming and efficiency, more particularly, a variation in the Q value of a vibrator in which the mechanical coupling can be eliminated or reduced by cutting one of the two corners A of the driving-side arm 14 shown in FIG. 25. Before the frequency adjustment, the leakage voltage was about –50 dB. After the frequency adjustment for equalizing the anti-resonance frequency to the resonance frequency, the leakage voltage become as large as –20 dB. Such an increased leakage voltage could be drastically reduced to a level denoted by *1 approximately equal to –50 dB by cutting at least one of the two corners 14 of the driving-side arm 14. When one of the corners B was cut instead of the corners A, the leakage voltage was increased to a level denoted by *3.

If the two arms 12 and 14 are greatly unbalanced, the mechanical coupling may not be reduced drastically by cutting one or both of the corners A. In such a case, trimming of the corners A' or B' is effective in reduction of the mechanical coupling, as indicated by *2 shown in FIG. 26.

Figure 27:
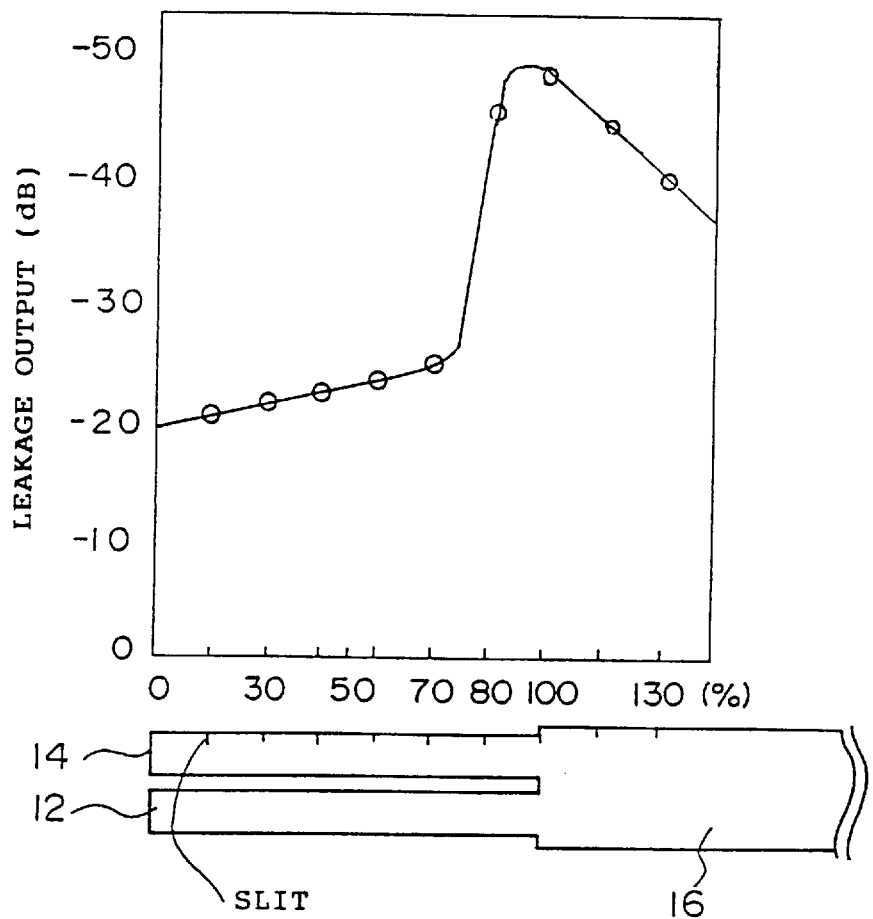
FIG. 27 is a diagram showing the relationship between the trimming position and the resultant effect.

FIG. 27 shows the relationship between the trimming position and the leakage voltage. In FIG. 27 the end (free end) of the arm 14 is indicated as 0% and the root thereof is indicated as 100%. In the experiment for obtaining the graph of FIG. 27, LiTaO₃ 130° rotation y-plate single crystal was used. The vibrator shown in FIG. 27 is slightly different from that shown in FIG. 7 in that the bottom portion 16 of the vibrator is slightly wider than the opposite ends of the arms 12 and 14. However, the graph of FIG. 27 substantially holds true for the vibrator shown in FIG. 7.

The corner of the arm 14 is cut by projecting a laser beam thereon, so that a slit is formed. The width of the slit thus formed is approximately equal to the diameter of the laser beam spot. The laser beam is projected onto the corner of the arm 14 so that the slit extends the same distance on the surfaces forming the corner. It can be seen from the graph of FIG. 27 that the slit should be provided within the range between the 70% position and the 100% position in order to drastically reduce the leakage output (approximately −45 dB for 80%). It is also possible to reduce the leakage output by at least 5 dB by forming the slit between the 50% position and the 70% position. Hence, it is possible to perform a rough adjustment by forming the slit between the 70% position and the 100% position and a subsequent fine adjustment by forming the slit between the 50% position and the 70% position. Even when the slit is formed between the 0% position and the 50% position on the arm 14, only 5dB or less can be improved, and the leakage voltage cannot be substantially reduced.

The above substantially holds true for a slit formed on the detection-side arm 12 in addition to the slit formed on the arm 14. Further, the same results as described above will be obtained when a LiNbO₃ single crystal is used. Furthermore, similar results will be obtained for a vibrator having a piezoelectric member which is provided on a thin plate.

Figure 28:
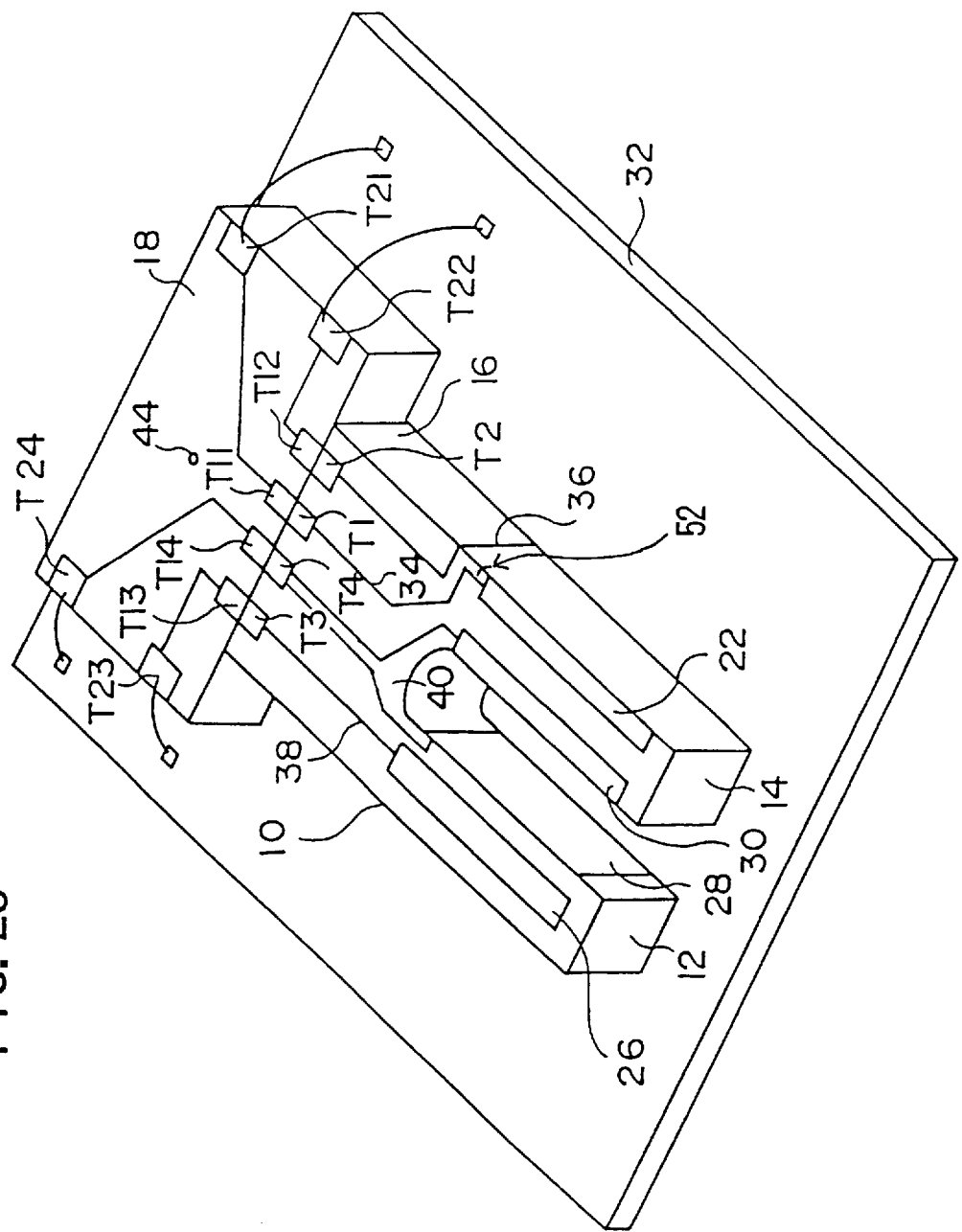
FIG. 28 is a perspective view of a gyro having a slit functioning to reduce the mechanical coupling.

FIG. 28 shows a vibrator having a slit functioning to reduce the mechanical coupling. In FIG. 28, parts that are the same as those shown in FIG. 7 are given the same reference numbers. The vibrator shown in FIG. 28 has a slit 52 formed on the corner of the driving-side arm 14. The other parts shown in FIG. 28 are the same as those shown in FIG. 7.

Figure 29:
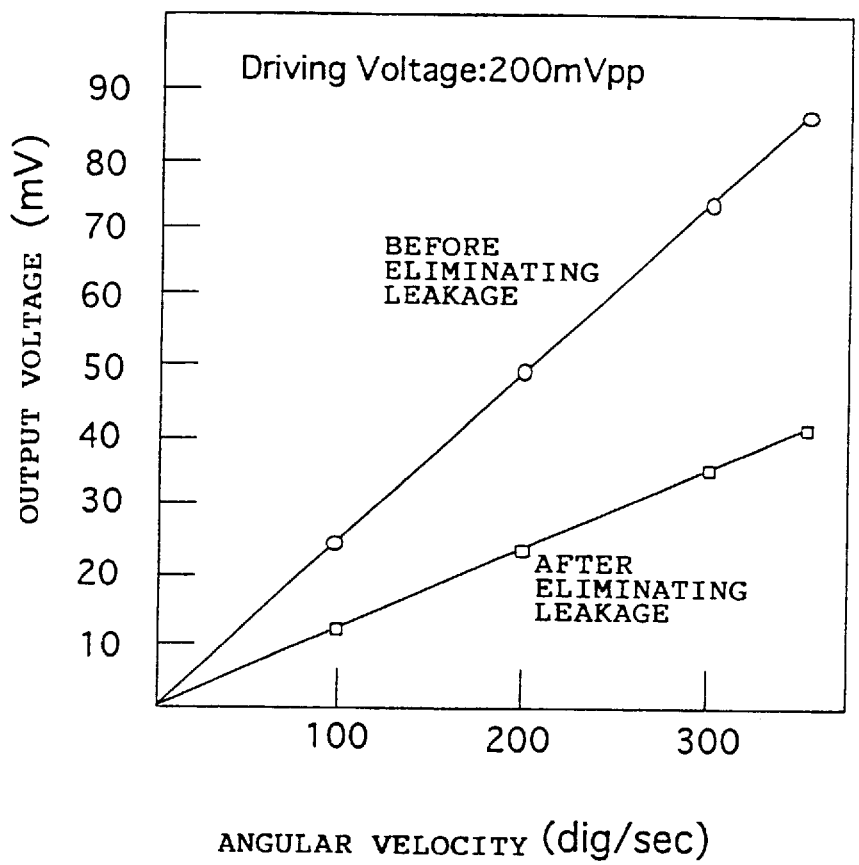
FIG. 29 is a graph of the characteristics of the gyro shown in FIG. 28.

FIG. 29 is a graph showing the relationship between the output voltage and the angular velocity obtained before and after the mechanical coupling is eliminated by providing at least one slit in the manner as described previously. The measurement system shown in FIG. 22 was used to obtain the graph of FIG. 29. A driving voltage of 200 mvpp was applied while the gyro was rotated at an angular velocity of 1 deg/sec. The output voltage obtained was 0.12 mV/(deg/sec) before eliminating the mechanical coupling, and was 0.55 mV(deg/sec) after eliminating the mechanical coupling. That is, the sensitivity of the gyro was improved by eliminating the mechanical coupling by the aforementioned manner.

Figure 30:
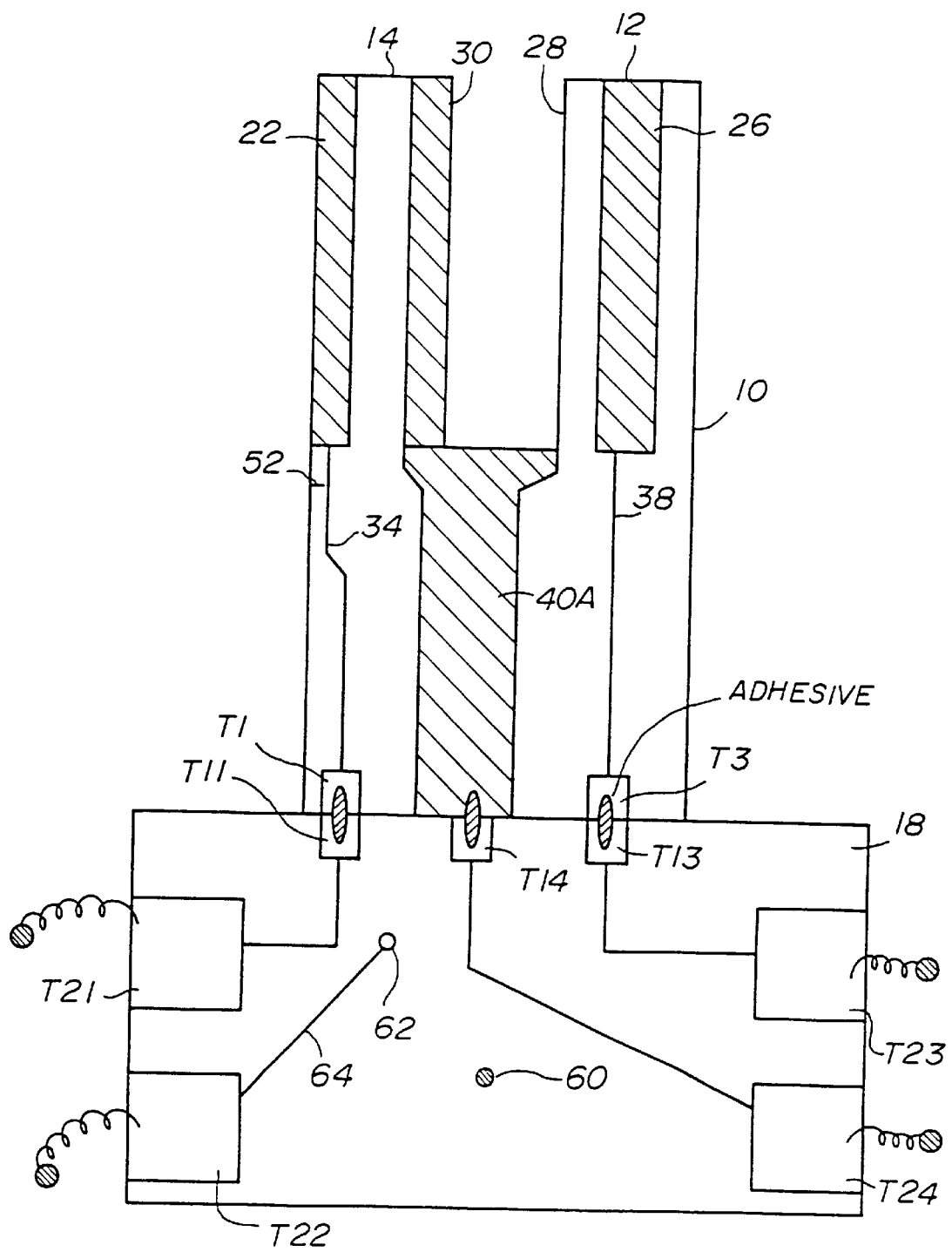
FIG. 30 is a plan view of an alternative gyro.

FIG. 30 is a plan view of an alternative of the assembly of the tuning fork 10 and the supporting member 18. In FIG. 30, parts that are the same as those shown in FIG. 28 are given the same reference numbers. The tuning fork 10 shown in FIG. 30 has wiring patterns different from those of the vibrator shown in FIG. 28. A wide wiring pattern 40A extends from the electrodes 28 and 30. A wiring pattern extending from the electrode 24 (which does not appear in FIG. 30) is provided on the back surface of the tuning fork 10, and coupled to a wiring pattern 64 formed on the supporting member 18 via terminals corresponding to the aforementioned terminals T2 and T12 and a through hole 62 in which an electrically conductive member is provided. The other parts shown in FIG. 30 are almost the same as those shown in FIG. 28.

The wiring pattern 40A, set to the ground level, is wider than the wiring pattern 40 shown in FIG. 28, and thus provides a more effective shielding effect. Of course, the structure shown in FIG. 30 can be applied to the structure shown in FIG. 7. In this case, the slit 52 shown in FIG. 30 is not provided.

The embodiments of the present invention have been described in detail. The gyro of the present invention can be applied to various devices and systems such as car navigation systems, suspension control systems and portable video cameras.

It is possible to detect angular velocities in a plurality of directions by means of a plurality of gyros, each being configured as described above.

The present inventors found the other relations between the parameters of the vibrator element (tuning fork vibrator) and the characteristics thereof. A description will now be given, with reference to FIG. 31 of parameters being considered in the following.

Figure 31:
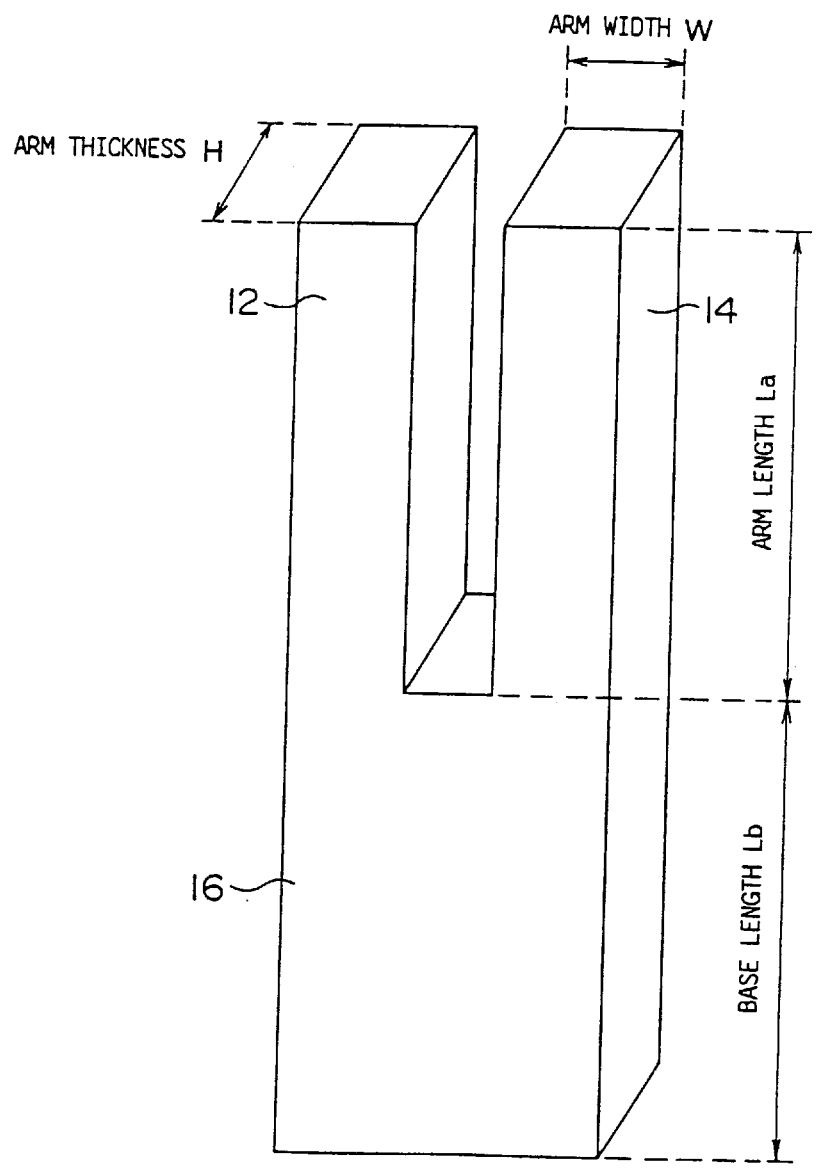
FIG. 31 is a perspective view of a tuning fork vibrator made of a single crystal of LiTaO$_3$.

FIG. 31 is a perspective view of a tuning fork vibrator made of a single crystal of LiTaO₃. Symbol La denotes the length of each of the arms 12 and 14 (arm length), and W denotes the width of each of the arms 12 and 14 (arm width). Symbol H denotes the thickness of each of the arm 12 and 14 (arm thickness), and symbol Lb is the length of the base portion 16.

Figure 32:
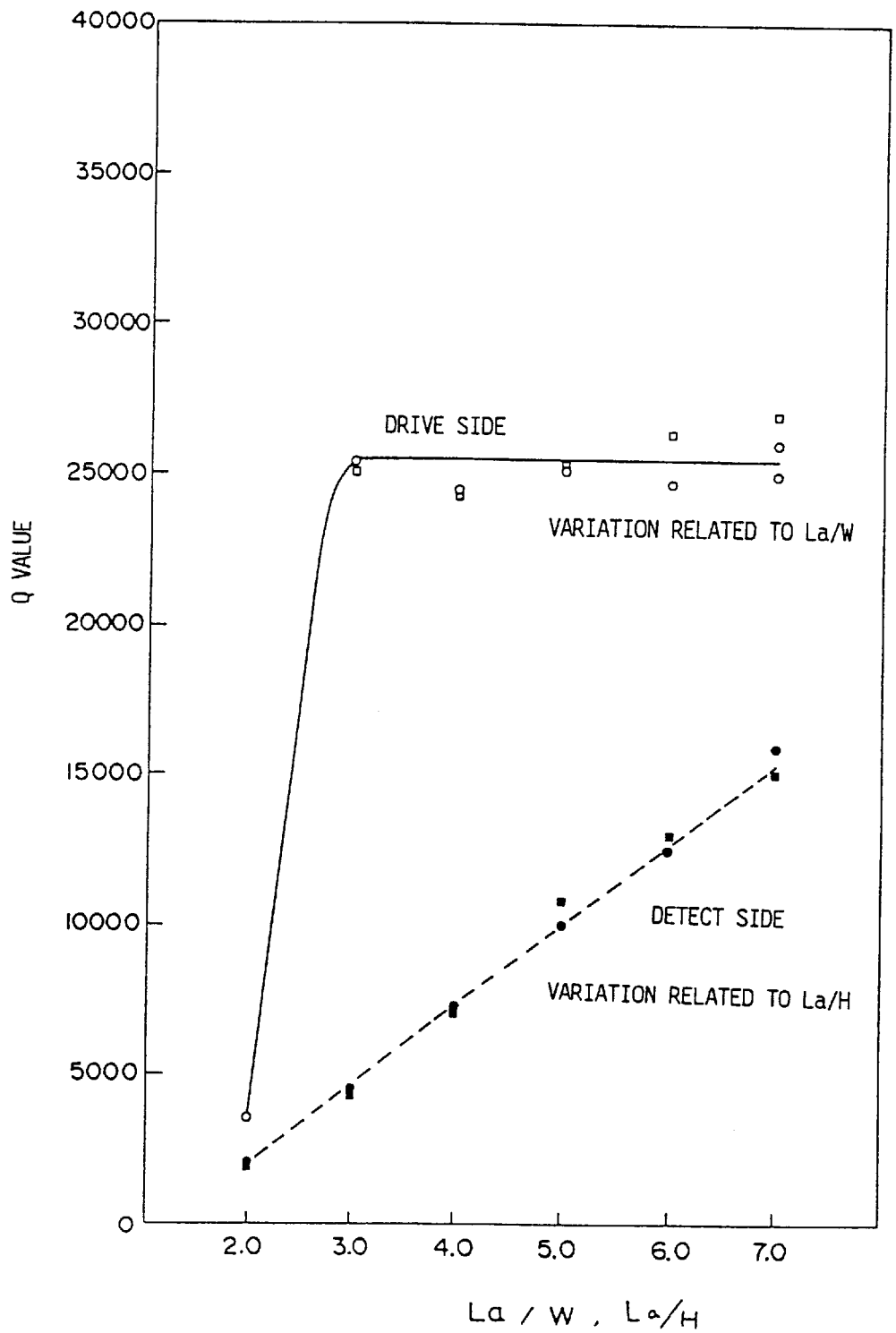
FIG. 32 a graph of a relation between the Q value of the fx-mode vibration (driving vibration) of the tuning fork vibrator made of LiTaO$_3$ and La/W and another relation between the fy-mode vibration (detection vibration) thereof and La/H.

FIG. 32 is a graph of a relation between the Q value of the fx-mode vibration (driving vibration) of the tuning fork vibrator made of LiTaO₃ and La/W and another relation between the fy-mode vibration (detection vibration) thereof and La/H. As shown in FIG. 32, the Q value of the fx-mode vibration is almost constant when La/W is equal to or greater than 3.0. In this state, the element characteristic of the fx-mode vibration is stable. The Q value of the fy-mode vibration increases in proportion to La/H. Hence, it can be seen from FIG. 32 that the Q value of the fy-mode vibration can be adjusted without affecting the fx-mode vibration by changing La/H under the condition that the driving-side arm is formed so that La/W≧3.0. In practice, it may be convenient to produce the detection-side arm in the same condition as that for the driving-side arm which satisfies that La/W is equal to or greater than 3.0 (that is, the detection-side arm has the same shape as the driving-side arm). The driving-side arm greatly depends on the arm width W, while the detection-side arm greatly depends on the arm thickness H because these arms vibrate in the different modes.

Figure 33:
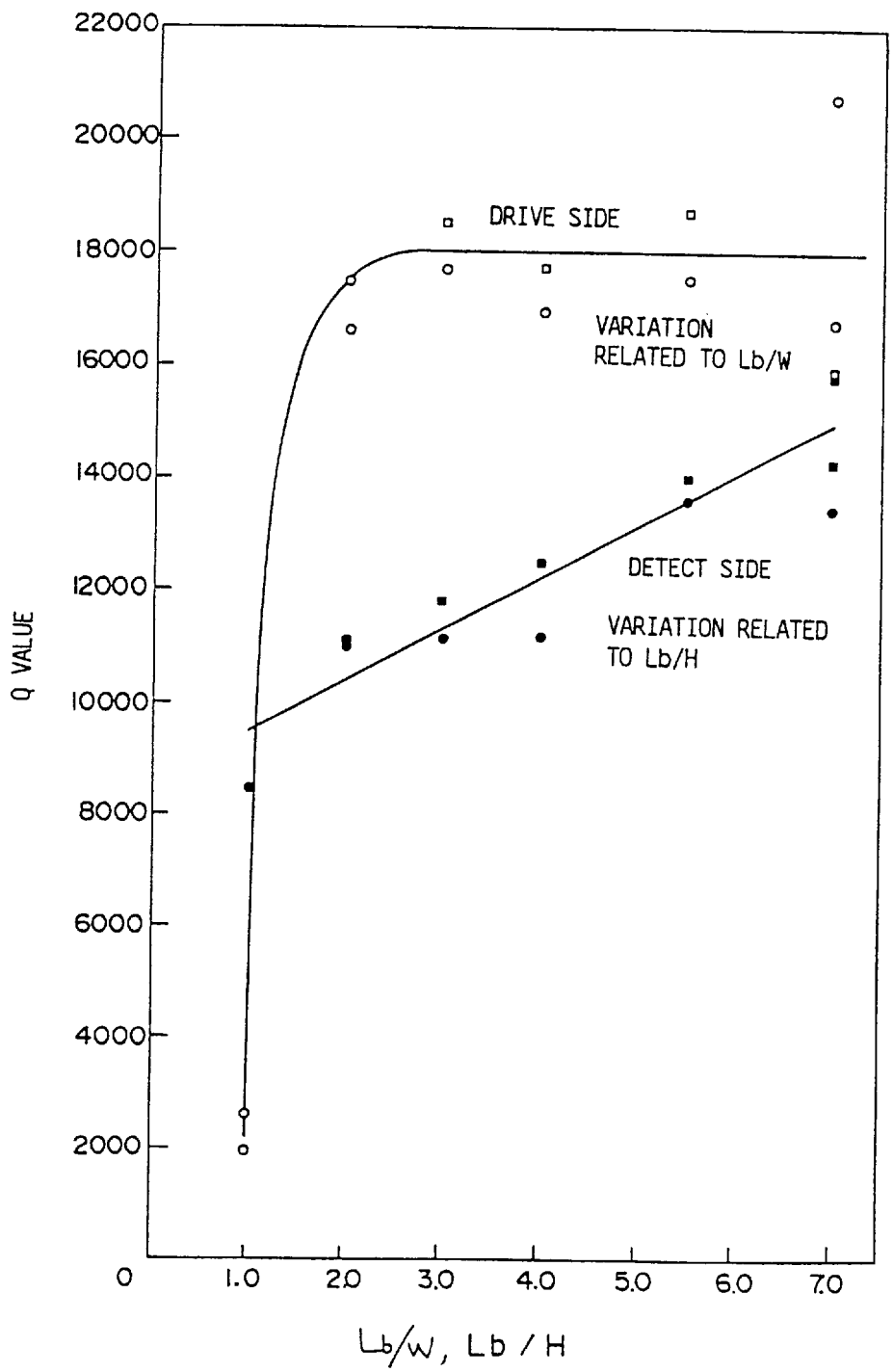
FIG. 33 is a graph of a relation between the Q value of the fx-mode vibration of the above tuning fork vibrator and Lb/H and another relation between the Q value of the fy-mode vibration thereof and Lb/W.

FIG. 33 is a graph of a relation between the Q value of the fx-mode vibration of the above tuning fork vibrator and Lb/H and another relation between the Q value of the fy-mode vibration thereof and Lb/W. As shown in FIG. 33, the A value of the fx-mode vibration is almost constant when Lb/W is equal to or greater than 1.5, and thus the element characteristic of the fx-mode vibration is in the stable range. The Q value of the fy-mode vibration increases in proportion to Lb/H. Hence, it can be seen from FIG. 33 that the Q value of the fy-mode vibration can be adjusted without affecting the fx-mode vibration by changing Lb/H under the condition that the driving-side arm satisfies Lb/W≧1.5. In practice, it may be convenient to produce the detection-side arm in the same condition as that for the driving-side arm which satisfies that Lb/W is equal to or greater than 1.5 (that is, the detection-side arm has the same shape as the driving-side arm).

The detection sensitivity of the tuning fork vibrator is proportional to the Q value of the fy-mode vibration, while the stability thereof is inversely proportional thereto. Hence, it is necessary to make it easily possible to obtain a desired Q value of the fy-mode vibration. The term "easily" means that the Q value of the fy-mode vibration can be adjusted without paying particular attention to the Q value of the fx-mode vibration. The adjustment work will be very troublesome if the Q value of the fx-mode is changed when adjusting the Q value of the fy-mode vibration.

It can be seen from the above that only the Q value of the fy-mode vibration can be adjusted without affecting the Q value of the fx-mode vibration by satisfying La/W≧3.0, or Lb/W≧1.5 or both.

Figure 34:
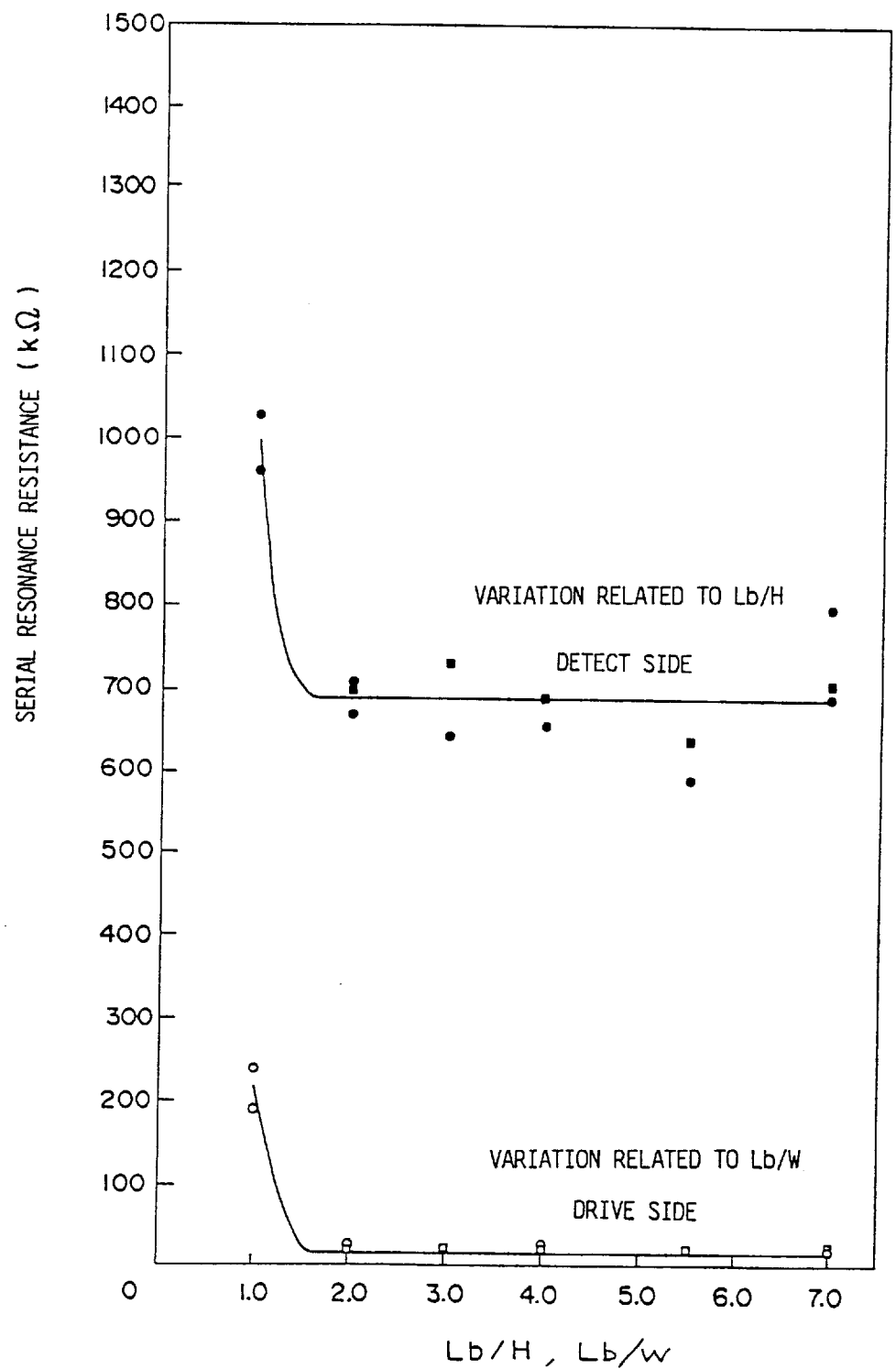
FIG. 34 is a graph of a relation between the series resonance resistance (kΩ) of the fx-mode vibration of the above tuning fork vibrator and Lb/H and another relation between the series resonance resistance (kΩ) of the fy-mode vibration thereof and Lb/W.

FIG. 34 is a graph of a relation between the series resonance resistance (kΩ) of the fx-mode vibration of the above tuning fork vibrator and Lb/H and another relation between the series resonance resistance (kΩ) of the fy-mode vibration thereof and Lb/W. The fx-mode vibration is in the stable range when Lb/W is equal to or greater than 1.5 and the fy-mode vibration is in the stable range when Lb/H is equal to or greater than 1.5. The series resonance resistance of the fx-mode vibration in the stable range is approximately equal to 20 kΩ, and the series resonance resistance of the fy-mode vibration in the stable range is approximately equal to 700 kΩ. It can be seen from the above that the tuning fork vibrator can vibrate at a stable resonance frequency under the condition that Lb/H≧1.5 and Lb/W≧1.5.

Figure 35:
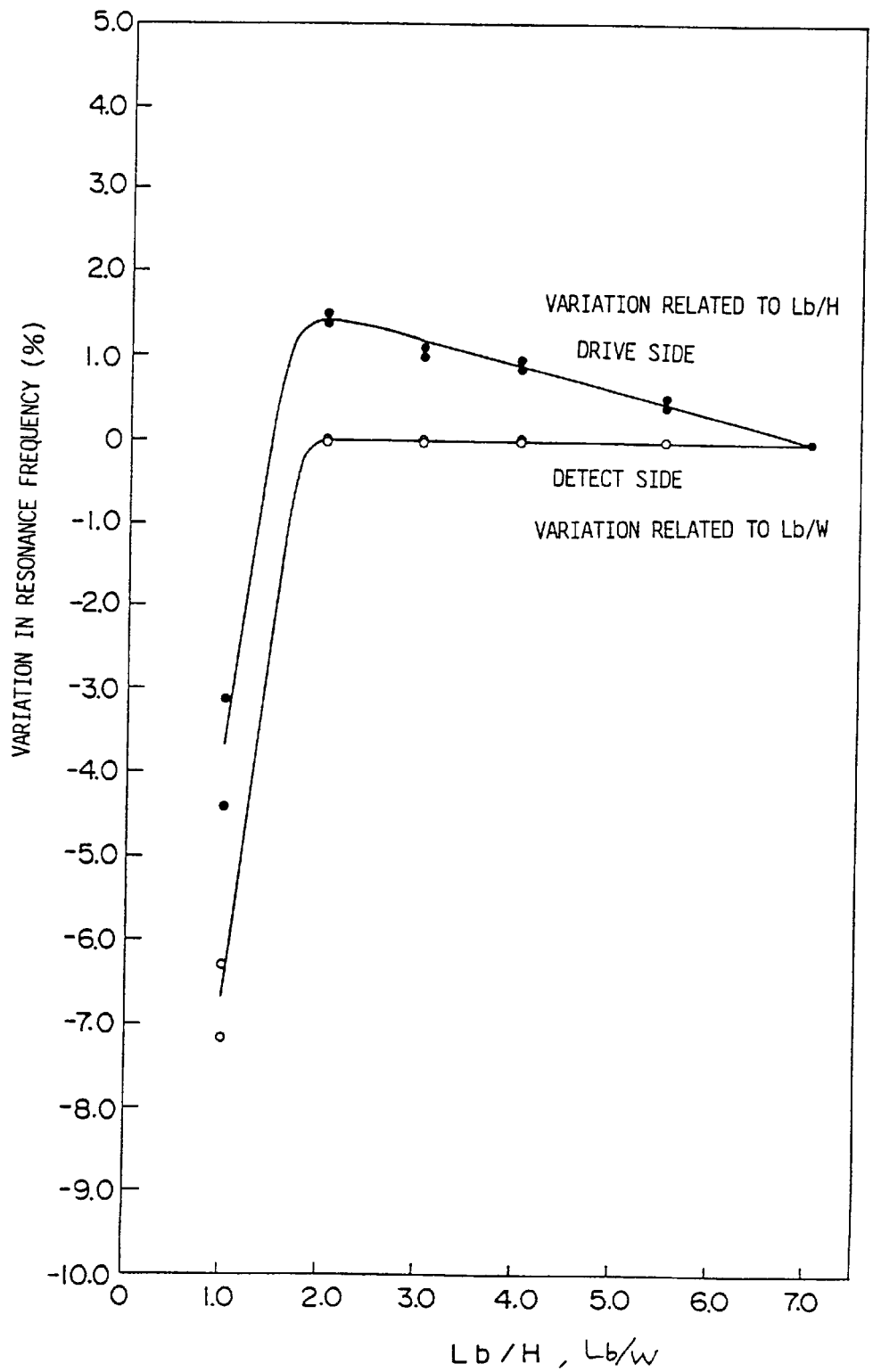
FIG. 35 is a graph of a relation between a variation in the resonance frequency of the fx-mode vibration of the above tuning fork and Lb/W and another relation between a variation in the resonance frequency of the fy-mode vibration thereof and Lb/H.

FIG. 35 is a graph of a relation between a variation in the resonance frequency of the fx-mode vibration of the above tuning fork and Lb/W and another relation between a variation in the resonance frequency of the fy-mode vibration thereof and Lb/H. It can be seen from FIG. 35 that the resonance frequencies of the fx-mode and fy-mode vibrations change greatly when Lb/H and Lb/W is less than 1.5. However, when Lb/W is equal to or greater than 1.5, the resonance frequency of the fx-mode vibration does not change at all, while the resonance frequency of the fy-mode vibration decreases as Lb/H increases. Hence, it can be seen from the above that the resonance frequencies of the fx-mode and fy-mode vibrations can be separately adjusted. Because there is a large variation in the resonance frequency when Lb/H is less than 1.5k it is preferable that Lb/H be equal to or greater than 1.5.

The temperature-frequency characteristic of the tuning-fork vibrator is very important when reducing it to practical use. In the temperature-frequency characteristic of the tuning-fork vibrator, it is preferable that there be a small difference between a frequency variation of the fx-mode vibration with respect to a temperature change and a frequency vibration of the fy-mode vibration with respect thereto. The difference between the frequency variations can be compensated for to a certain extent by modifying the driving circuit which causes the fx-mode vibration or the detection circuit which causes the fy-mode vibration or both.

Figure 36:
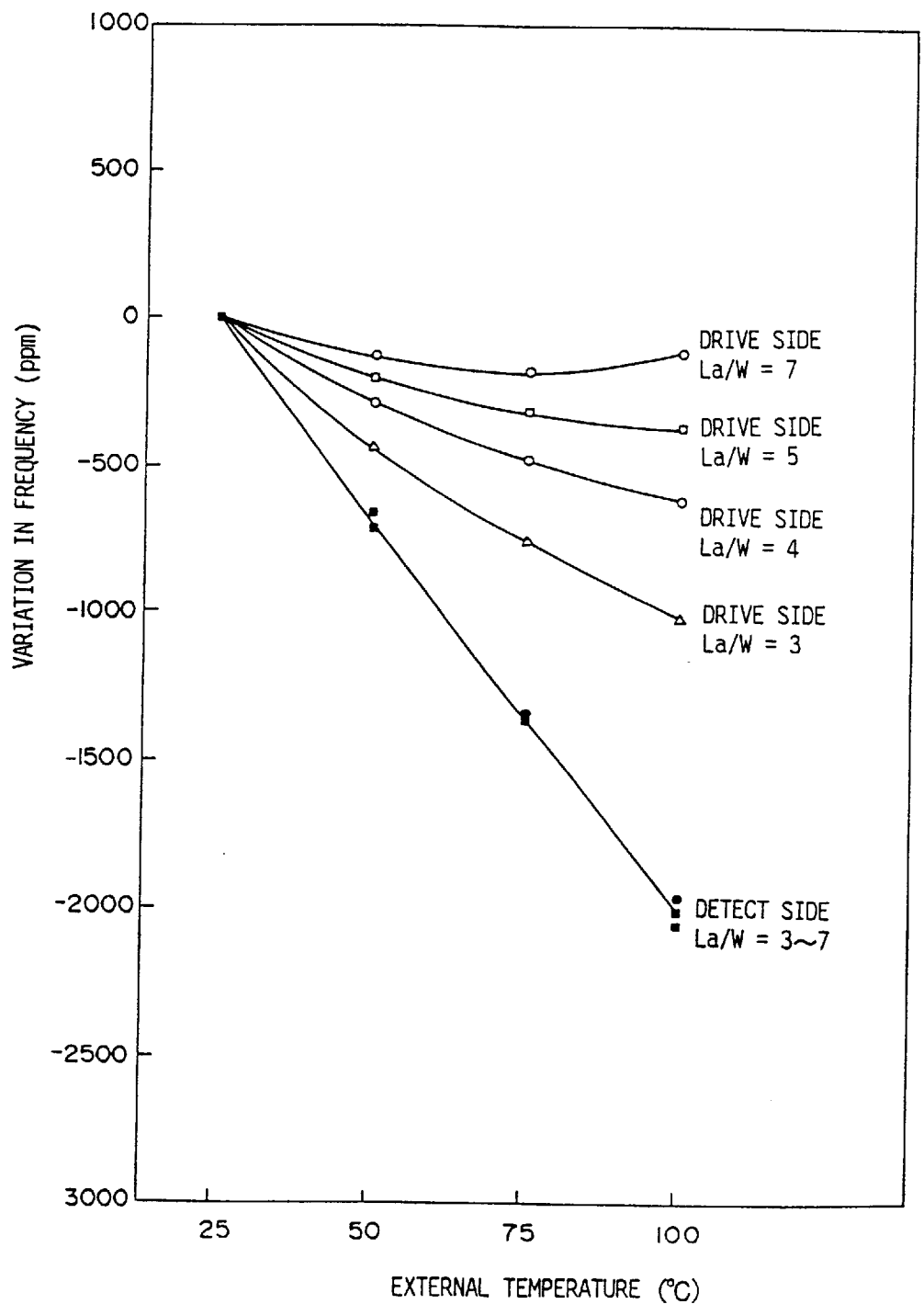
FIG. 36 is a graph showing the amount of frequency change (ppm) with respect to the external temperature.

The present inventors found that the arm length depends on the frequency-temperature characteristic of the tuning-fork vibrator. FIG. 36 is a graph showing the amount of frequency change (ppm) with respect to the external temperature. It can be seen from FIG. 36 that as the arm length La increases (arm width W is equal to the arm thickness H and is constant), the peak temperature of the temperature-frequency characteristic of the fx-mode shifts towards the low-temperature side. The amount of the frequency on the detection side is almost constant while changing La/W. It can be seen from the above that the temperature-frequency characteristic can be adjusted by changing the arm length La.

As to the adjustment of the above ratios, it will be easier to adjust the arm length La or the base length Lb than the other parameters. Hence, it can be said that FIG. 32 shows a variation in the Q value as a function of the arm length La under the condition that the arm width W and the arm thickness H are constant and FIG. 36 shows a variation in the frequency as a function of the arm length La under the same condition as the above. It can also be said that FIGS. 33, 34 and 35 show variations in the Q value, the series resonance resistance and the resonance frequency as a function of the base length Lb while the arm width W and the arm thickness H are constant.

It will be noted that another piezoelectric single crystal other than LiTaO$_3$ for example, LiNbO$_3$ show trends similar to the above-described trends.

The present invention is not limited to the specifically disclosed embodiments, and variations and modifications may be made without departing from the scope of the present invention.

What is claimed is:

1. A vibratory gyro comprising:
   a tuning-fork vibrator having a piezoelectric member; and
   a supporting member supporting the tuning-fork vibrator,
   said tuning-fork vibrator having a driving-side vibration mode and a detection-side vibration mode different from said driving-side vibration mode,
   wherein said tuning-fork vibrator comprises:
      first and second arms;
      detection electrodes provided only on the first arm;
      driving electrodes provided only on the second arm; and
      a ground electrode provided on the second arm such that the driving electrodes are in a floating state with respect to the ground electrode,
   said tuning-fork vibrator including a base portion integrally formed with the first and second arms,
   said tuning-fork vibrator resonating in the driving-side vibration mode, and both said tuning-fork vibrator and said supporting member resonating together as a whole in the detection-side vibration mode, and
   at least one of the first and second arms satisfying a predetermined dimensional condition such that the driving-side vibration mode has a Q value which is constant in a stable frequency range.

2. The vibratory gyro as claimed in claims 1, wherein a resonance frequency of the driving-side vibration mode is substantially equal to an anti-resonance frequency of the detection-side vibration mode.

3. The vibratory gyro as claimed in claim 2, wherein a mechanical Q value of the detection-side vibration mode is less than that of the driving-side vibration mode.

4. The vibratory gyro as claimed in claim 1, wherein a mechanical Q value of the detection-side vibration mode is less than that of the driving-side vibration mode.

5. The vibratory gyro as claimed in claim 1, wherein the detection electrodes include an electrode connected to said ground electrode.

6. The vibratory gyro as claimed in claim 5 wherein:
   the second arm has four surfaces and a substantially rectangularly-shaped cross-section; and
   said electrode connected to said ground electrode is provided on three of said four surfaces of said second arm.

7. The vibratory gyro as claimed in claim 1, wherein said supporting member comprises means for adjusting an elastic characteristic of the supporting member so that an anti-resonance frequency of the detection-side vibration mode is substantially equal to a resonance frequency of the driving-side vibration mode.

8. The vibratory gyro as claimed in claim 7, wherein said means comprises a groove for adjusting a stiffness of the supporting member.

9. The vibratory gyro as claimed in claim 7, wherein said means comprises a weight member provided on the supporting member.

10. The vibratory gyro as claimed in claim 1, wherein said vibrator has a thickness substantially equal to a thickness of the supporting member.

11. The vibratory gyro as claimed in claim 1, further comprising an adhesive layer which fixedly secures the vibrator and the supporting member together.

12. The vibratory gyro as claimed in claim 1, wherein the supporting member has a first end portion and the supporting member comprises means for attenuating the detection-side vibration at the first end portion of the supporting member.

13. The vibratory gyro as claimed in claim 12, wherein said means comprises relatively wide portions and relatively narrow portions which are alternately arranged between the first end portion and a second end portion in which the vibrator is attached to the supporting member.

14. The vibratory gyro as claimed in claim 1, further comprising a supporting portion which supports the supporting member on a predetermined member.

15. The vibratory gyro as claimed in claim 14, wherein said supporting portion comprises a pin member and an elastic member supporting the pin member.

16. The vibratory gyro as claimed in claim 1, further comprising:

a first electrode pattern formed on the vibrator;

a second electrode pattern formed on the supporting member; and a connecting member electrically connecting the first electrode pattern and the second electrode pattern together.

17. The vibratory gyro as claimed in claim 16, wherein said connecting member comprises one of solder and paste.

18. The vibratory gyro as claimed in claim 1, wherein the vibrator comprises a piezoelectric single crystal.

19. The vibratory gyro as claimed in claim 1, wherein the predetermined dimensional condition includes limitations regarding a width and length of said at least one of the first and second arms.

20. The vibratory gyro as claimed in claim 1, wherein the predetermined dimensional condition includes limitations regarding a width thereof and a length of the base portion.

21. The vibratory gyro as claimed in claim 1, wherein the other one of the first and second arms satisfies a ratio of a length to a thickness so that the detection-side vibration mode has a given Q value.

22. The vibratory gyro as claimed in claim 1, wherein the other one of the first and second arms satisfies a ratio of a thickness thereto to a length of the base portion so that the detection-side vibration mode has a given Q value.

23. The vibratory gyro as claimed in claim 1, wherein:

said at least one of the first and second arms has a length La and a width W; and the predetermined dimensional condition is such that La/W is equal to or greater than 1.5.

24. The vibratory gyro as claimed in claim 1, wherein:

said at least one of the first and second arms has a width;

the base portion has a length Lb; and the predetermined dimensional condition is such that Lb/W is equal to or greater than 1.5.

25. The vibratory gyro as claimed in claim 1, wherein said at least one of the first and second arms has a ratio of a length to a width so that the drive-side vibration mode has a given frequency vs. temperature characteristic.

26. The vibratory gyro as claimed in claim 1, wherein the base portion has a length which corresponds to a resonance frequency of the drive-side vibration mode and a resonance frequency of the detection-side vibration mode.

27. The vibratory gyro as claimed in claim 1, wherein:

at least one of the first and second arms has a thickness H;

the base portion has a length Lb; and said predetermined dimensional condition is such that Lb/H is equal to or greater than 1.5.

28. A sensor system comprising:

a vibratory gyro;

a driving circuit for driving the vibratory gyro; and a detector circuit for detecting an output signal output from the vibratory gyro, said vibratory gyro comprising:

a tuning-fork vibrator having first and second arms, detection electrodes provided only on the first arm, driving electrodes provided only on the second arm, a piezoelectric member, and a ground electrode provided in the second arm such that the driving electrodes are in a floating state with respect to the ground electrode; and a supporting member supporting the tuning-fork vibrator, said tuning-fork vibrator including a base portion integrally formed with the first and second arms, said tuning-fork vibrator having a driving-side vibration mode and a detection-side vibration mode different from said driving side vibration mode, said tuning-fork vibrator resonating in the driving-side vibration mode, and both said tuning-fork vibrator and said supporting member resonating together as a unit in the detectionside vibration mode, and at least one of the first and second arms satisfying a predetermined dimensional condition such that the driving-side vibration mode has a Q value which is constant in a stable frequency range.

* * * * *